(12) United States Patent
Jeon

(10) Patent No.: US 9,754,960 B2
(45) Date of Patent: Sep. 5, 2017

(54) SEMICONDUCTOR MEMORY DEVICE INCLUDING POWER DECOUPLING CAPACITOR

(71) Applicant: SK hynix Inc., Icheon-si, Gyeonggi-do (KR)

(72) Inventor: Jae Eun Jeon, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/000,635

(22) Filed: Jan. 19, 2016

(65) Prior Publication Data

US 2017/0053932 A1   Feb. 23, 2017

(30) Foreign Application Priority Data

Aug. 20, 2015  (KR) .................... 10-2015-0117507

(51) Int. Cl.
| | | |
|---|---|---|
| *H01L 27/115* | (2017.01) | |
| *H01L 23/528* | (2006.01) | |
| *H01L 21/768* | (2006.01) | |
| *H01L 27/11582* | (2017.01) | |
| *H01L 27/11568* | (2017.01) | |
| *H01L 27/11573* | (2017.01) | |
| *H01L 49/02* | (2006.01) | |

(Continued)

(52) U.S. Cl.
CPC .. *H01L 27/11582* (2013.01); *H01L 21/76897* (2013.01); *H01L 23/528* (2013.01); *H01L 23/5329* (2013.01); *H01L 23/53271* (2013.01); *H01L 27/11568* (2013.01); *H01L 27/11573* (2013.01); *H01L 28/40* (2013.01); *G11C 5/063* (2013.01); *G11C 5/147* (2013.01)

(58) Field of Classification Search
CPC ......... H01L 27/11573; H01L 27/11575; H01L 27/11582; H01L 23/528; H01L 21/76897
See application file for complete search history.

(56) References Cited

U.S. PATENT DOCUMENTS

| | | | | |
|---|---|---|---|---|
| 2009/0184389 | A1* | 7/2009 | Bertin ................. | H01L 29/861 257/476 |
| 2012/0129301 | A1* | 5/2012 | Or-Bach ............... | G11C 8/16 438/129 |

(Continued)

FOREIGN PATENT DOCUMENTS

| | | |
|---|---|---|
| KR | 1020140076799 A | 6/2014 |
| KR | 1020150027754 A | 3/2015 |

*Primary Examiner* — Thanh V Pham
(74) *Attorney, Agent, or Firm* — William Park & Associates Ltd.

(57) ABSTRACT

Provided herein is a semiconductor memory device including: a memory cell array having a multilayer stacked structure; and a peripheral circuit configured to drive the memory cell array. The peripheral circuit includes a power decoupling capacitor circuit configured to provide decoupling capacitors to the memory cell array and the peripheral circuit. The power decoupling capacitor circuit includes conductive lines which are alternately stacked on top of one another, a plurality of semiconductor pillars configured to pass through the conductive lines, a horizontal connector configured to connect the semiconductor pillars to each other, and a vertical connector configured to pass through the conductive lines and insulated from the horizontal connector.

17 Claims, 25 Drawing Sheets

(51) Int. Cl.
*H01L 23/532* (2006.01)
*G11C 5/06* (2006.01)
*G11C 5/14* (2006.01)

(56) References Cited

U.S. PATENT DOCUMENTS

| | | | |
|---|---|---|---|
| 2013/0242643 A1* | 9/2013 | Kim | G11C 5/14 |
| | | | 365/149 |
| 2015/0179661 A1* | 6/2015 | Huo | H01L 21/764 |
| | | | 257/57 |
| 2015/0340376 A1* | 11/2015 | Park | H01L 27/11582 |
| | | | 257/329 |

\* cited by examiner

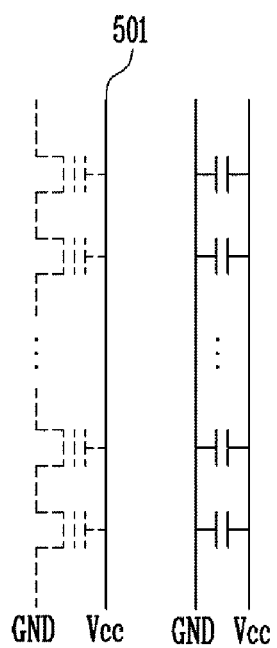

SEMICONDUCTOR MEMORY DEVICE INCLUDING POWER DECOUPLING CAPACITOR

CROSS-REFERENCE TO RELATED APPLICATION

The present application claims priority to Korean patent application number 10-2015-0117507 filed on Aug. 20, 2015, the entire disclosure of which is incorporated herein in its entirety by reference.

BACKGROUND

Field of Invention

Various embodiments of the present disclosure relate to an electronic device, and more particularly, to a semiconductor memory device.

Description of Related Art

Semiconductor memory devices are memory devices embodied using a semiconductor such as silicon (Si), germanium (Ge), gallium arsenide (GaAs), Indium phosphide (InP), or the like. Semiconductor memory devices are classified into volatile memory devices and nonvolatile memory devices.

A volatile memory device is a memory device in which stored data is lost when power is turned off. Representative examples of the volatile memory devices include static RAM (SRAM), dynamic RAM (DRAM), synchronous DRAM (SDRAM), etc. A nonvolatile memory device is a memory device in which stored data is maintained even when power is turned off. Representative examples of nonvolatile memory devices include read only memory (ROM), programmable ROM (PROM), electrically programmable ROM (EPROM), electrically erasable programmable ROM (EEPROM), flash memory, phase-change random access memory (PRAM), magnetic RAM (MRAM), resistive RAM (RRAM), ferroelectric RAM (FRAM), etc. Flash memory is classified into NOR type and NAND type memory.

SUMMARY

Various embodiments of the present disclosure are directed to a semiconductor memory device which has an increased degree of integration.

One embodiment of the present disclosure provides a semiconductor memory device including: a memory cell array having a multilayer stacked structure; and a peripheral circuit configured to drive the memory cell array, wherein the peripheral circuit comprises a power decoupling capacitor circuit configured to provide decoupling capacitors to the memory cell array and the peripheral circuit, wherein the power decoupling capacitor circuit comprises: conductive lines alternately stacked on top of one another; a plurality of semiconductor pillars configured to pass through the conductive lines; a horizontal connector configured to connect the semiconductor pillars to each other; and a vertical connector configured to pass through the conductive lines and insulated from the horizontal connector.

Another embodiment of the present disclosure provides a semiconductor memory device including: a semiconductor substrate including a cell region and a peripheral circuit region; conductive lines stacked on top of one another in the cell region and the peripheral circuit region; a plurality of semiconductor pillars configured to pass through the conductive lines; a horizontal connector configured to connect the semiconductor pillars that are disposed in the peripheral circuit region; and a vertical connector configured to pass through the conductive lines that are disposed in the peripheral circuit region, the vertical connector being insulated from the horizontal connector.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey a scope of example embodiments to those skilled in the art.

In the drawing figures, dimensions may be exaggerated for clarity of illustration. It will be understood that when an element is referred to as being "between" two elements, the element can be the only element between the two elements, or one or more intervening elements may also be present. Like reference numerals refer to like elements throughout.

FIG. 6B illustrates a configuration of the power decoupling capacitor circuit according to the present disclosure;

DETAILED DESCRIPTION

Figure 1:
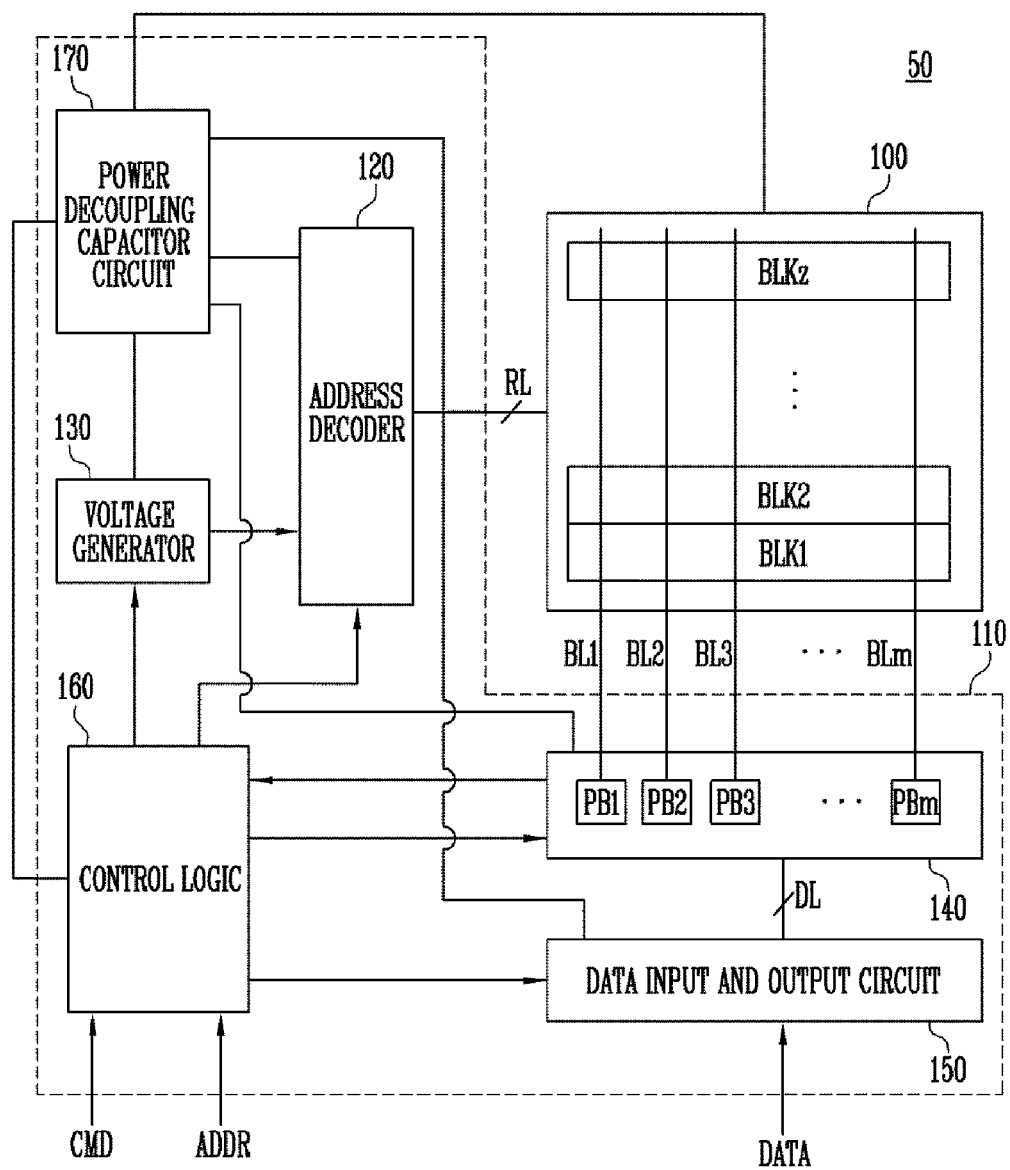
FIG. 1 is a block diagram illustrating a semiconductor memory device according to an embodiment of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure will be described in detail based on embodiments. The present disclosure may, however, be embodied in many different forms and should not be construed as being limited to only the embodiments set forth herein, but should be construed as covering modifications, equivalents or alternatives falling within ideas and technical scopes of the present disclosure.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

It will be understood that when an element is referred to as being "coupled" or "connected" to another element, the element can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations thereof, but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make subject matter of the present disclosure clear.

Hereinafter, embodiments of the present disclosure will be described in detail with reference to the accompanying drawings.

A semiconductor memory device may include a capacitor which is connected between an input voltage Vcc and a ground. The capacitor may reduce power noise generated when power for driving the device is supplied thereto. This capacitor is typically called a power decoupling capacitor. The power decoupling capacitor prevents rapid variation of the input voltage Vcc. As rapid variation of the input voltage Vcc is prevented, the semiconductor memory device malfunction can be prevented. An embodiment of the present disclosure proposes a semiconductor memory device including a power decoupling capacitor having a three-dimensional structure in a peripheral circuit region.

FIG. 1 is a block diagram illustrating a semiconductor memory device according to an embodiment of the present disclosure.

Referring to FIG. 1, the semiconductor memory device 50 includes a memory cell array 100 and a peripheral circuit 110.

The memory cell array 100 includes a plurality of memory blocks BLK1 to BLKz. The memory blocks BLK1 to BLKz are connected to an address decoder 120 through row lines RL. The memory blocks BLK1 to BLKz are connected to a read-and-write circuit 140 through bit lines BL1 to BLm. The row lines RL may include source selection lines, word lines, and drain selection lines.

Each of the memory blocks BLK1 to BLKz includes a plurality of memory cell strings. Each cell string includes a plurality of non-volatile memory cells which are stacked on top of one another on a substrate, such that the memory cell array has a multilayered stacked structure. In an embodiment, the plurality of memory cells can store one or more bits per cell. The memory cell array 100 will be explained in more detail in the description pertaining to FIGS. 3 to 5.

The peripheral circuit 110 is configured to drive the memory cell array 100. Referring again to FIG. 1, the peripheral circuit 110 includes the address decoder 120, a voltage generator 130, the read-and-write circuit 140, a data input and output circuit 150, a control logic 160, and a power decoupling capacitor circuit 170.

The address decoder 120 is connected to the memory cell array 100 through the row lines RL. The address decoder 120 is configured to operate under control of the control logic 160.

The address decoder 120 receives addresses ADDR through the control logic 160. A program operation of the semiconductor memory device 50 is performed in word line unit. When performing a program operation, the addresses ADDR may include a block address and a row address.

The address decoder 120 is configured to decode a block address from among the received addresses ADDR. The address decoder 120 selects a corresponding one of the memory blocks BLK1 to BLKz in response to the decoded block address.

The address decoder 120 is configured to decode a row address among the received addresses ADDR. In response to the decoded row address, the address decoder 120 applies voltages, provided from the voltage generator 130, to the row lines RL and selects one word line of a selected memory block BLK1 to BLKz.

In an embodiment, the address decoder 120 may include an address buffer, a block decoder, a row decoder, etc.

The voltage generator 130 is configured to generate a plurality of voltages from an external power voltage that is applied to the semiconductor memory device 50. The voltage generator 130 operates under control of the control logic 160.

In an embodiment, the voltage generator (130) may regulate an external power voltage to produce an internal power voltage. The semiconductor memory device 50 uses the internal power voltage produced in the voltage generator 130 as an operating voltage.

In an embodiment, the voltage generator (130) may use the external power voltage or the internal power voltage to produce a plurality of voltages. For example, the voltage generator 130 may include a plurality of pumping capacitors that receives the internal power voltage. Under control logic 160 control, the voltage generator may selectively activate the plurality of pumping capacitors to produce a plurality of voltages. The produced voltages are applied to the word lines by the address decoder 120. During a program operation, the voltage generator 130 may produce a program pulse having a high voltage and a pass pulse which has a lower voltage level than the program pulse. During a program verification operation, the voltage generator 130 may produce a verification voltage and a verification pass voltage which has a higher voltage level than the verification voltage.

The read-and-write circuit 140 includes first to m-th page buffers PB1 to PBm. The first to m-th page buffers PB1 to PBm are connected to the memory cell array 100 through the first to m-th bit lines BL1 to BLm, respectively. The first to m-th page buffers PB1 to PBm operate under control of the control logic 160.

The first to m-th page buffers PB1 to PBm exchange data with the data input and output circuit 150. During a program operation, the first to m-th page buffers PB1 to PBm receive data DATA for storage through the data input and output circuit 150 and data lines DL. When a program pulse is applied to a selected word line, the first to m-th page buffers PB1 to PBm may transmit data DATA to be stored to selected memory cells of memory blocks BLK1 to BLKz through the bit lines BL1 to BLm. A memory cell connected to a bit line to which a program allowable voltage (for example, a ground voltage) is applied may have an increased threshold voltage. A threshold voltage of a memory cell connected to a bit line to which a program inhibit voltage (for example, a supply voltage) is applied may be maintained. During a program verification operation, the first to m-th page buffers PB1 to PBm read page data from selected memory cells through the bit lines BL1 to BLm.

In an embodiment, the read-and-write circuit 140 may include a row selection circuit.

The data input and output circuit 150 is connected to the first to m-th page buffers PB1 to PBm through the data lines DL. The data input and output circuit 150 operates under the control of the control logic 160. During a program operation, the data input and output circuit 150 receives data DATA to be stored from an external controller (not shown).

The control logic 160 is connected to the address decoder 120, the voltage generator 130, the read-and-write circuit 140, and the data input and output circuit 150. The control logic 160 receives a command CMD and addresses ADDR from the external controller.

The control logic 160 is configured to control the address decoder 120, the voltage generator 130, the read-and-write circuit 140, and the data input and output circuit 150 in response to a command CMD. The control logic 160 transmits the received addresses ADDR to the address decoder 120.

The power decoupling capacitor circuit 170 includes a plurality of power decoupling capacitors. The power decoupling capacitor circuit 170 may provide the plurality of power decoupling capacitors to the memory cell array 100 and the peripheral circuit 110. The plurality of power decoupling capacitors may operate as decoupling capacitors for the memory cell array 100 of the semiconductor memory device 50 and the circuits included in the peripheral circuit 110.

The power decoupling capacitor circuit 170 is independently connected to each of the components of the semiconductor device. That is, the power decoupling capacitor circuit 170 may be independently connected to each of the memory cell array 100, the address decoder 120, the voltage generator 130, the read-and-write circuit 140, the data input and output circuit 150, and the control logic 160.

The power decoupling capacitor circuit 170 may have a three-dimensional structure similar to that of the three-dimensional memory cell array 100. The power decoupling capacitor circuit 170 functions to prevent voltages input to components of the semiconductor memory device 50 from rapidly varying. The power decoupling capacitor circuit 170 according to an embodiment of the present disclosure will be explained in more detail in the description pertaining to FIGS. 6 to 10.

Figure 2:
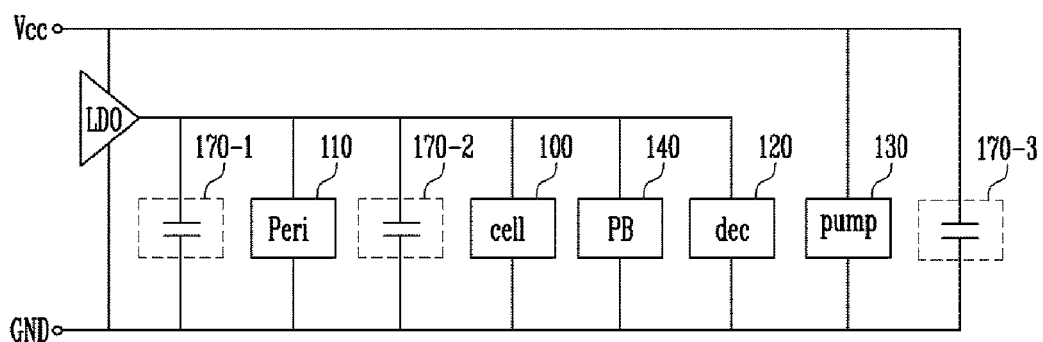
FIG. 2 is a diagram illustrating connection of a power decoupling capacitor circuit.

FIG. 2 is a diagram illustrating connection of a power decoupling capacitor circuit.

Referring to FIG. 2, although the power decoupling capacitor circuit according to the present disclosure is formed in the peripheral circuit region, the power decoupling capacitor circuit can be independently connected to each of the components of the semiconductor memory device. In detail, the power decoupling capacitor may be independently connected to each of the memory cell array 100, the read-and-write circuit 140, the address decoder 120, and the voltage generator 130, etc., which are components of the peripheral circuit 110.

Power decoupling capacitors 170-1, 170-2, and 170-3 prevent voltages input to components of the semiconductor memory device from rapidly varying. For example, when voltages applied to the components are greatly reduced, voltages that have been charged in advance in the power decoupling capacitors are applied to the components. Charging the voltages in advance prevents rapid variation of the input voltages. Furthermore, when voltages applied to the components are excessively increased, the power decoupling capacitors store electric charge and use the stored electric charge to prevent the semiconductor memory device from malfunctioning when the input voltages are greatly reduced.

An embodiment of the present disclosure provides the semiconductor memory device including a power decoupling capacitor formed in the peripheral circuit region. In one example, the power decoupling capacitor circuit has a cell cap shape similar to the three-dimensional structure of the memory cell array 100.

Figure 3:
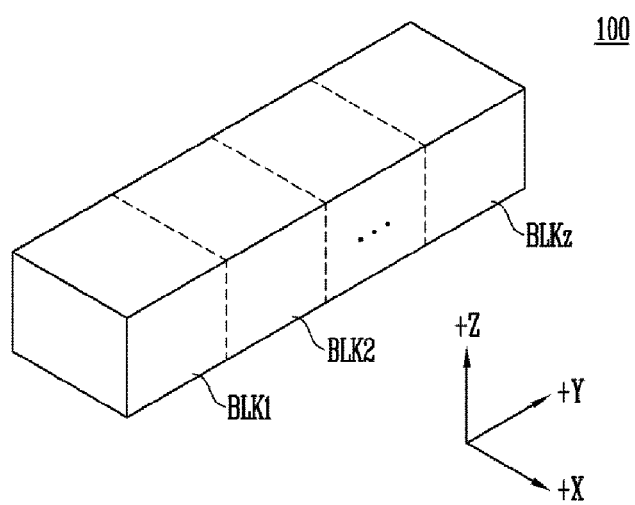
FIG. 3 is a block diagram showing an embodiment of a memory cell array 100 of FIG. 1.

FIG. 3 is a block diagram showing an embodiment of the memory cell array 100 of FIG. 1.

Referring to FIG. 3, the memory cell array 100 includes the plurality of memory blocks BLK1 to BLKz. Each memory block has a three-dimensional structure. Each memory block includes a structure extending in the X, Y, and Z directions. Each memory block may include a plurality of cell strings which are arranged in first and third directions. Each cell string may be a structure extending in a second direction. The memory blocks BLK1 to BLKz are connected to the address decoder 120 through the row lines RL. The memory blocks BLK1 to BLKz are connected to the read-and-write circuit 140 through the bit lines BL1 to BLm. Each of the memory blocks BLK1 to BLKz includes a plurality of memory cells. In an embodiment, the memory cells may be non-volatile memory cells.

Figure 4:
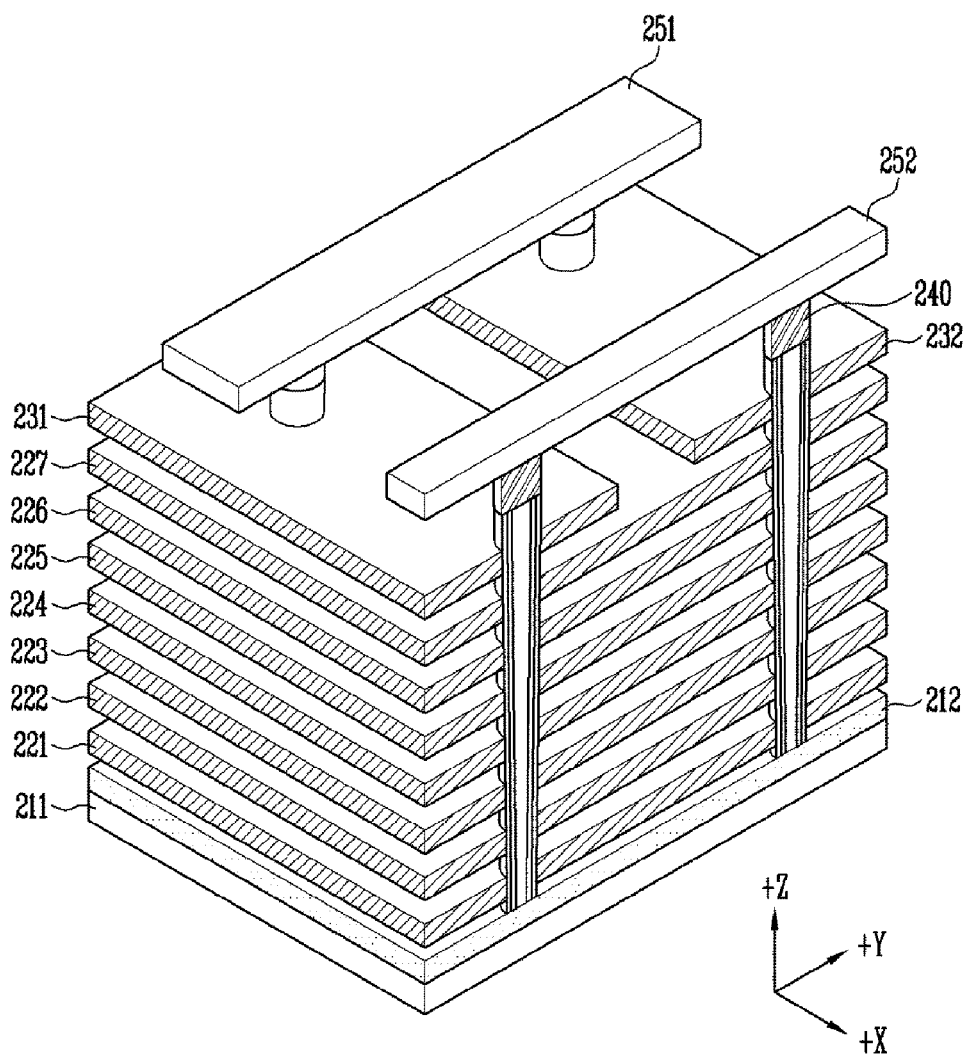
FIG. 4 is a perspective view showing an embodiment of any one of a plurality of memories constituting the memory cell array of FIG. 3.

FIG. 4 is a perspective view showing an embodiment of any one of a plurality of memory blocks constituting the memory cell array of FIG. 3.

Referring to FIG. 4, a substrate 211 of a first type (e.g., a p type) provides thereon a doping region 212 of a second type (e.g., an n type). The substrate 211 may be provided as a pocket p-well provided in an n-well.

First to seventh conductive substances 221 to 227 are provided at positions spaced apart from the doping region 212 of the second type by predetermined distances with respect to the Z direction. Each of the first to seventh conductive substances 221 to 227 extends in the X and Y directions. Eighth conductive substances 231 and 232 are provided at positions spaced apart from the seventh conductive substance 227 in the Z direction by a predetermined distance. The eighth conductive substances 231 and 232 are spaced apart from each other in the Y direction. In an embodiment, the first to seventh conductive substances 221 to 227 and the eighth conductive substances 231 and 232 may be made of polysilicon.

Although not shown in FIG. 4, insulation material may be formed between the first to seventh conductive substances 221 to 227 and the eighth conductive substances 231 and 232. For instance, the insulation material may include silicon oxide.

Hereinafter, the first to seventh conductive substances 221 to 227 are defined as respectively disposed at first to seventh heights. The eighth materials 231 and 232 are defined as being disposed at an eighth height.

A plurality of semiconductor pillars or pillars are provided to pass through the first to seventh conductive substances 221 to 227 and the eighth conductive substances 231 and 232 and are spaced apart from each other in the X and Y directions. Each pillar extends in the Z direction. In an embodiment, the widths of each pillar with respect to the X and Y directions may narrow as the pillar approaches the substrate.

In an embodiment, each pillar includes an internal material, an intermediate layer, and a surface layer. The internal material includes an insulation material. For example, the internal material may include silicon oxide or air gap. The intermediate layer includes a silicon material doped using a first type. The intermediate layer of the pillar functions as a Z-direction channel. The surface layer is configured to store data. For example, the surface layer includes a tunneling insulation film, a charge storage film, and a blocking insulation film which are successively disposed from the intermediate layer.

In an embodiment, the tunneling insulation film may include a thermal oxide film. The charge storage film may include a nitride layer or a metal oxide film. The blocking insulation film may include a dielectric layer having a dielectric constant higher than that of the tunneling insulation film and the charge storage film.

A drain 240 is provided on each of the pillars. For example, each drain 240 includes a silicon material doped using a second type. Extending in the Y direction, top conductive substances 251 and 252 are provided on the drains. The top conductive substances 251 and 252 are spaced apart from each other in the X direction.

The top conductive substances 251 and 252 are made of metal. In an embodiment, the top conductive substances 251 and 252 may be formed of polysilicon.

Each pillar, and each of the conductive substances in a region adjacent to the pillar operate as a single cell transistor. That is, the intermediate layer of the pillar which functions as a channel, the tunneling insulation film, the charge storage film, and the blocking insulation film of the surface layer of the pillar, and the conductive substance which functions as a control gate of the pillar may form a single cell transistor.

Each pillar comes into contact with conductive substances disposed at the first to seventh heights and any one of the conductive substances disposed at the eighth height. Therefore, eight cell transistors per each pillar can be formed. Each pillar corresponds to a single cell string, each cell string may include cell transistors disposed at the first to eighth heights.

In FIG. 4, the first to eighth conductive substances 221 to 227, 231, and 232 of the eight layers are provided. However, this is given only for illustrative purposes. It will be understood that conductive substances of more or less than eight layers may be provided.

In FIG. 4, two pillars are illustrated as being connected to each bit line. However, this is given only for the sake of explanation and it will be appreciated that more than two pillars may be connected to each bit line.

In FIG. 4, the top conductive substances 251 and 252 are provided. Each of the top conductive substances 251 and 252 may be connected to two bit lines. However, this is given only for the sake of explanation and it will be appreciated that two or more bit lines may be connected to the top conductive substances 251 and 252.

In other words, an N (where N is a natural number) number of bit lines may be provided, and an M (where M is a natural number) number of pillars may be connected to each bit line.

Figure 5:
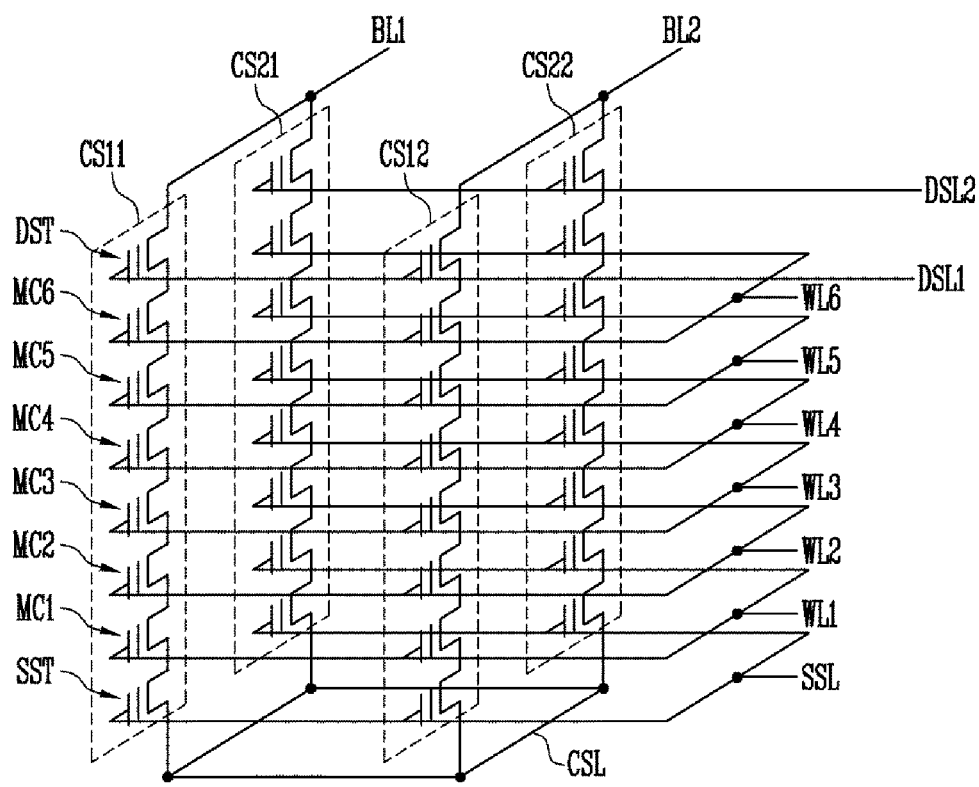
FIG. 5 is a circuit diagram showing an equivalent circuit of a memory block BLK1 illustrated with reference to FIG. 4.

FIG. 5 is a circuit diagram showing an equivalent circuit of a memory block BLK1 illustrated with reference to FIG. 4.

Referring to FIGS. 4 and 5, the doping region 212 having the second type will function as a common source line CSL. The first conductive substance 221 disposed at the first height functions as a source selection line SSL. The second to seventh conductive substances 222 to 227 disposed at the second to seventh heights respectively function as first to sixth word lines WL1 to WL6. The eighth conductive substances 231 and 232 disposed at the eighth height respectively function as first and second drain selection lines DSL1 and DSL2. The top conductive substance 251 and 252 respectively function as first and second bit lines BL1 and BL2.

As described with reference to FIG. 4, each pillar corresponds to a single cell string CS. In the embodiment of FIG. 4, because four pillars are provided, the memory block BLK1 includes fourth cell strings CS11, CS12, CS21, and CS22.

Hereinafter, the cell strings CS11, CS12, CS21, and CS22 will be defined in units of rows and columns.

The cell strings are connected in common to each bit line. The cell strings are defined as a single column. The cell strings CS11 and CS21 that are connected to the first bit line BL1 defines a first column. The cell strings CS12 and CS22 that are connected to the second bit line BL2 defines a second column.

The cell strings, which are connected to each drain selection line, are defined as a single row. The cell strings CS11 and CS21, which are connected to the first drain selection line DSL1, refers to a first row. The cell strings CS21 and CS22, which are connected to the second drain selection line DSL2, refers to a second row.

As described with reference to FIG. 4, each cell string CS includes cell transistors disposed at the first to eighth heights. In each cell string CS, the cell transistor disposed at the first height functions as a source selection transistor SST. The cell transistors disposed at the second to seventh heights in each cell string CS respectively function as first to sixth memory cells MC1 to MC6. The cell transistor disposed at the eighth height in each cell string CS functions as a drain selection transistor DST. The selection transistors SST and DST and the memory cells MC1 to MC6 may have the same structure.

The source selection transistors SST of the cell strings CS are connected in common to the source selection line SSL.

The memory cells that are at a same height are connected in common to a single word line. The first to sixth memory cells MC1 to MC6 of the cell strings CS are respectively connected to first to sixth word lines WL1 to WL6.

The cell strings in the same row are connected to the same drain selection line DSL. The cell strings in different rows are connected to different drain selection lines DSL. For example, the drain selection transistors DST of the cell strings CS11 and CS12 in the first row are connected to the first drain selection line DSL1. Further, the drain selection transistors DST of the cell strings CS21 and CS22 in the second row are connected to the second drain selection line DSL2.

When each of the drain selection lines DSL1 and DSL2 is unselected, the cell strings (e.g., CS21 and CS22) connected to the unselected drain selection line (e.g., DSL2) are electrically separated from the corresponding bit lines, and the cell strings (e.g., CS11 and CS12) connected to the selected drain selection line (e.g., DSL1) are electrically connected to the corresponding bit lines.

The memory cells in each row at each height forms a single page. For example, among the memory cells disposed at the second height, the memory cells included in the cell strings CS11 and CS12 of the first row form a single page. Among the memory cells disposed at the second height, the memory cells included in the cell strings CS21 and CS22 of the second row form another signal page.

The program operation is performed in page units. During a program operation, one of the drain selection lines DSL1 and DSL2 may be selected, and one of the word lines may be selected. Then, of the cell strings (e.g., CS11 and CS12) connected to the selected drain selection line (e.g., DSL1), the memory cells connected to the selected word line may be programmed.

According to an embodiment of the present disclosure, the cell strings of one row are defined as a single cell string group. That is, the cell strings which are connected to each drain selection line are defined as one cell string group. The cell strings CS11 and CS12 in the first row comprise one cell string group. The cell strings CS21 and CS22 in the second row comprise another cell string group. According to an embodiment of the present disclosure, pages at one height are defined as a single page group. That is, the pages that are connected to a word line are defined as a single page group.

Figure 6A:
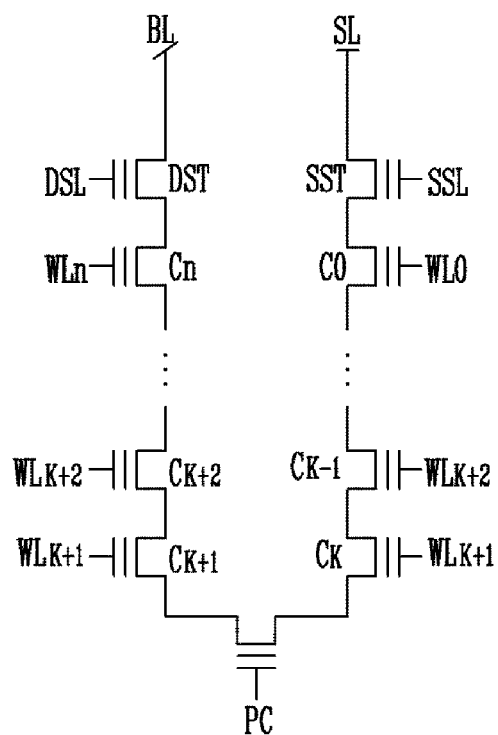
FIG. 6A is a circuit diagram showing an equivalent circuit of a cell string formed in a U shape.

FIG. 6A illustrates an equivalent circuit of a cell string formed in a U shape.

The three-dimensional memory cell array structure may include I-shaped cell strings shown in FIG. 4, or U-shaped cell strings shown in FIG. 6A.

In addition to the shapes illustrated in this specification, a cell string can have various other shapes. A cell string is configured such that a plurality of transistors are successively connected in series to adjacent transistors. A gate electrode of each transistor may operate as a word line. A first end of the cell string may operate as a bit line, and a second end thereof may operate as a source line.

The cell string includes a source selection transistor SST and memory cells C0 to Ck, which are arranged in a direction perpendicular to the substrate between the source line SL and a pipe channel layer PC, and a drain selection transistor DST and memory cells Ck+1 to Cn, which are arranged in a direction perpendicular to the substrate between the bit line BL and the pipe channel layer PC.

In an example embodiment, at least one of the memory cells C0 to Cn may operate as a dummy memory cell. The dummy memory cell may prevent a threshold voltage interference between the memory cells C0 to Cn.

In the cell string of FIG. 6A, gate electrodes of the memory cells C0 to Ck and the source selection transistor SST may be connected together. The memory cells C0 to Ck and the source selection transistor SST may also be arranged in a direction perpendicular to the substrate between the source line SL and the pipe channel layer PC. Word lines of the memory cells Ck+1 to Cn and the drain selection line may be connected to a single node. The word lines of the memory cells Ck+1 to Cn and the drain selection line may be arranged in a direction perpendicular to the substrate between the bit line BL and the pipe channel layer PC. That is, a structure accounted for in which the drain selection transistor DST and the gate electrodes of the memory cells Ck+1 to Cn are connected to a single node. In the single-node connection structure, when power Vcc is applied to a connected node 501 shown in FIG. 6B and a ground voltage GND is applied to the bit line or the source line, each transistor can operate as a capacitor. This is conceptually represented in FIG. 6B.

FIG. 6B illustrates a configuration of the power decoupling capacitor circuit according to the present disclosure.

An embodiment of the present disclosure proposes a structure and method of forming a power decoupling capacitor circuit of a semiconductor memory device by modifying a three-dimensional memory cell array structure, as shown in FIG. 6B. A structure of the power decoupling capacitor circuit according to the present disclosure will be explained in more detail with reference to FIGS. 7 to 10. The power decoupling capacitor circuit may be included in a peripheral circuit region and provide power decoupling capacitors for elements of the semiconductor memory device.

Figure 7:
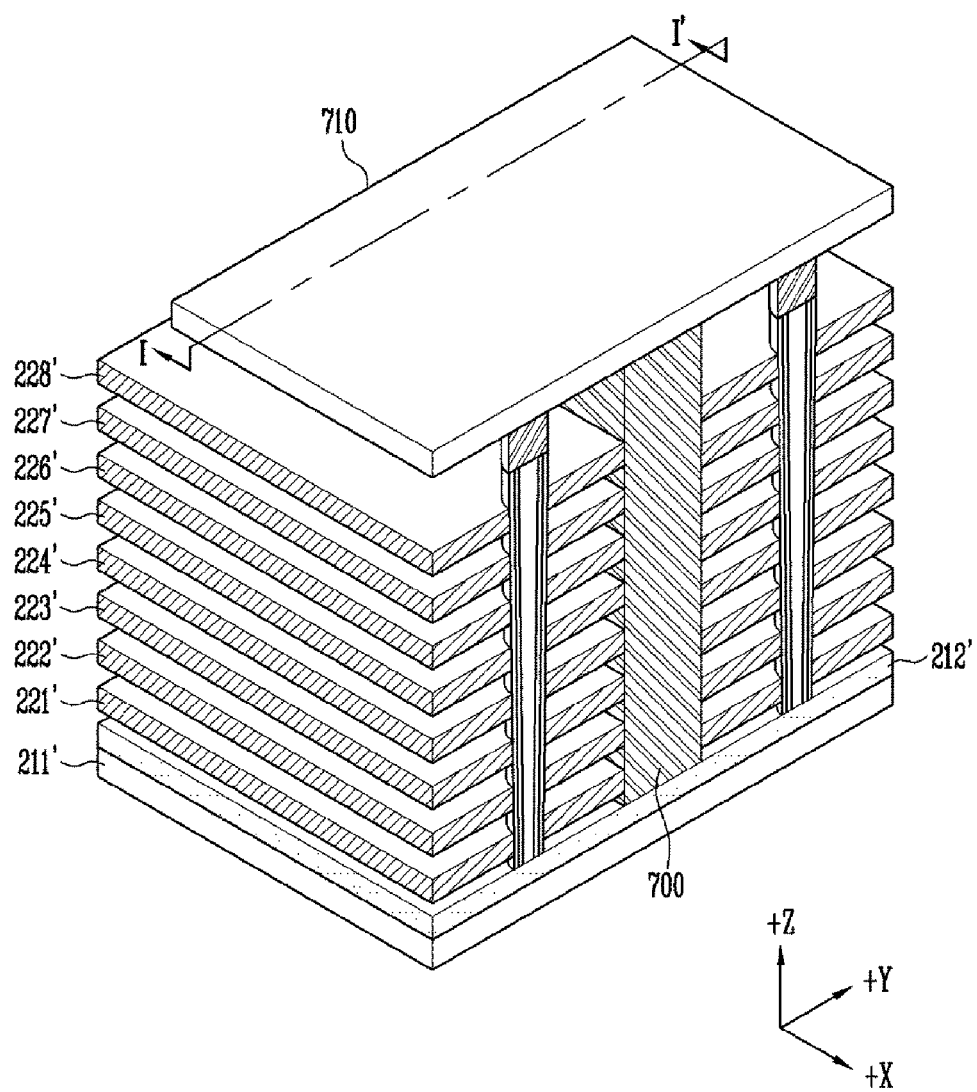
FIG. 7 is a perspective view showing a configuration of the power decoupling capacitor circuit of the semiconductor memory device according to an embodiment of the present disclosure.

FIG. 7 is a perspective view showing a configuration of the power decoupling capacitor circuit of a semiconductor memory device according to an embodiment of the present disclosure.

Referring to FIG. 7, the power decoupling capacitor circuit has a shape obtained by modifying the structure of the three-dimensional memory block shown in FIG. 4. In detail, based on the structure of the memory block of FIG. 4, the power decoupling capacitor circuit further includes a vertical connector 700 and a horizontal connector 710. Herebelow, the power decoupling capacitor circuit will be described centering on differences from the memory block of FIG. 4.

The power decoupling capacitor circuit includes a substrate 211' having a first type (e.g., a p type), and a doping region 212' which has a second type (e.g., an n type). The doping region 212' is provided on the substrate 211'. The substrate 211' may be provided as a pocket p-well provided in an n-well.

First to eighth conductive substances 221' to 228', which in one example are conductive lines, are provided at positions spaced apart from the doping region 212' by predetermined distances with respect to the Z direction. Each of the first to eighth conductive substances 221' to 228' extends in the X and Y directions. In an embodiment, the first to eighth conductive substances 221' to 228' may be formed of a conductive material which may be polysilicon.

Although not shown in FIG. 7, insulation material may be formed between the first to eighth conductive substances 221' to 228'. For instance, the insulation material may include silicon oxide.

Hereinafter, the first to eighth conductive substances 221' to 228' are defined as being respectively disposed at first to eighth heights. A plurality of pillars, which in one example are semiconductor pillars, are provided to pass through the first to eighth conductive substances 221' to 228' and the pillars are spaced apart from each other in the X and Y directions. Each pillar extends in the Z direction. In an embodiment, the widths of each pillar with respect to the X and Y directions may be reduced as the pillar approaches the substrate.

The vertical connector 700 is provided to partition the pillars with respect to the Y direction and pass through the first to eighth conductive substances 221' to 228' in the Z direction, and in one embodiment, the vertical connector 700 is insulated from the horizontal connector 710. The vertical connector 700 connects the first to eighth conductive substances 221' to 228' to each other with respect to the Z direction, i.e. a vertical direction. The vertical connector 700 may be made of conductive material, for example, polysilicon.

Each pillar includes an internal material, an intermediate layer, and a surface layer. The internal material includes an insulation material. For example, the internal material may include silicon oxide or an air gap. The intermediate layer includes a silicon material doped using a first type. The intermediate layer functions as a Z-direction channel. The surface layer includes a tunneling insulation film, a charge storage film, and a blocking insulation film which are successively disposed from the intermediate layer.

In an embodiment, the tunneling insulation film may include a thermal oxide film. The charge storage film may include a nitride layer or a metal oxide film. The blocking insulation film may include a dielectric layer having a dielectric constant higher than that of the tunneling insulation film and the charge storage film.

The horizontal connector 710 is provided on the pillars. The horizontal connector 710 includes a silicon material doped using a second type. The horizontal connector 710 is not connected to the vertical connector 700 and the horizontal connector 710 extends in the X and Y directions to connect the pillars that are disposed in the peripheral circuit region to each other. The horizontal connector 710 is made of metal. In an embodiment, the horizontal connector 710 may be formed of polysilicon.

Each pillar and each of the conductive substances in a region adjacent to the pillar operate as a transistor. That is, the intermediate layer of the pillar, the tunneling insulation film, the charge storage film, and the blocking insulation film of the surface layer of the pillar, and the conductive substance may form a single transistor.

Each pillar comes into contact with the conductive substances disposed at the first to eighth heights. Therefore, eight cell transistors per each pillar can be formed. When a power voltage Vcc is applied to the vertical connector 700 and a ground voltage GND is applied to the horizontal connector 710 the plurality of transistors may operate as capacitors, where the vertical connector 700 may be connected to the first to eight conductive substances 221' to 228' and the horizontal connector 710 may be connected to the intermediate layer of the pillar. It is assumed that each pillar corresponds to a single capacitor string, each capacitor string may include transistors disposed at the first to eighth heights.

In FIG. 7, the conductive substances 221' to 228' of the eight heights are provided. However, this is only for illustrative purposes, and it will be understood that conductive substances of eight or more or fewer layers can be provided.

In FIG. 7, four pillars are illustrated as being connected to the single horizontal connector 710. However, this is given only for the sake of explanation and it will be appreciated that four or more pillars may be connected to the single horizontal connector 710.

Figure 8:
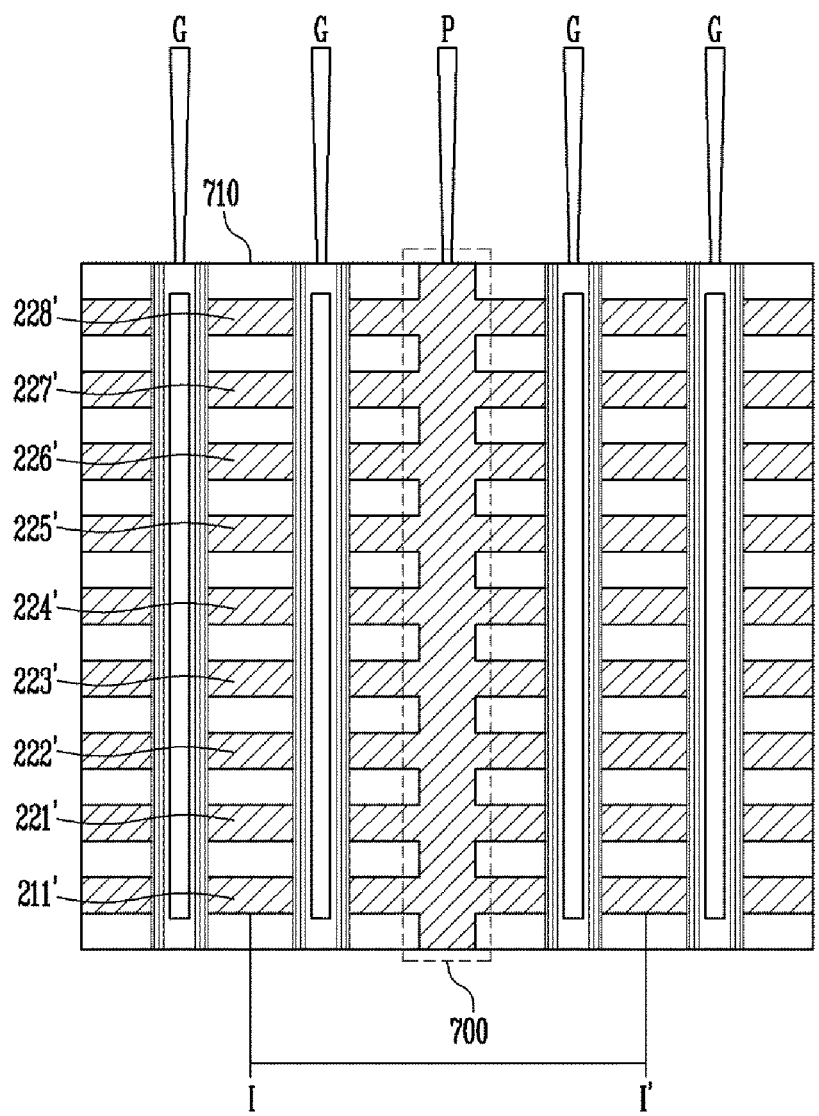
FIG. 8 is a sectional view taken along line I-I' of FIG. 7 showing the power decoupling capacitor circuit.

FIG. 8 is a sectional view taken along line I-I' of FIG. 7 showing the power decoupling capacitor circuit.

Referring to FIG. 8, the horizontal connector 710 is provided to be connected to the plurality of pillars. Contact plugs G to which the ground voltage is applied are provided, in one example, on upper portions of the horizontal connectors 710. A contact plug P to which the power voltage is applied is provided, for example, on an upper portion of the vertical connector 700.

The first to eighth conductive substances 221' to 228' may be electrically connected to the vertical connector 700. The internal materials, the intermediate layers and the surface layers of the pillars may be electrically connected to the horizontal connector 710. Therefore, when the power voltage is applied to the contact plug connected to the vertical connector 700 and the ground voltage is applied to the contact plugs connected to the horizontal connectors 710, the transistors formed from the plurality of pillars operate as capacitors. In this way, the power decoupling capacitors can be provided in the semiconductor memory device.

Figure 9:
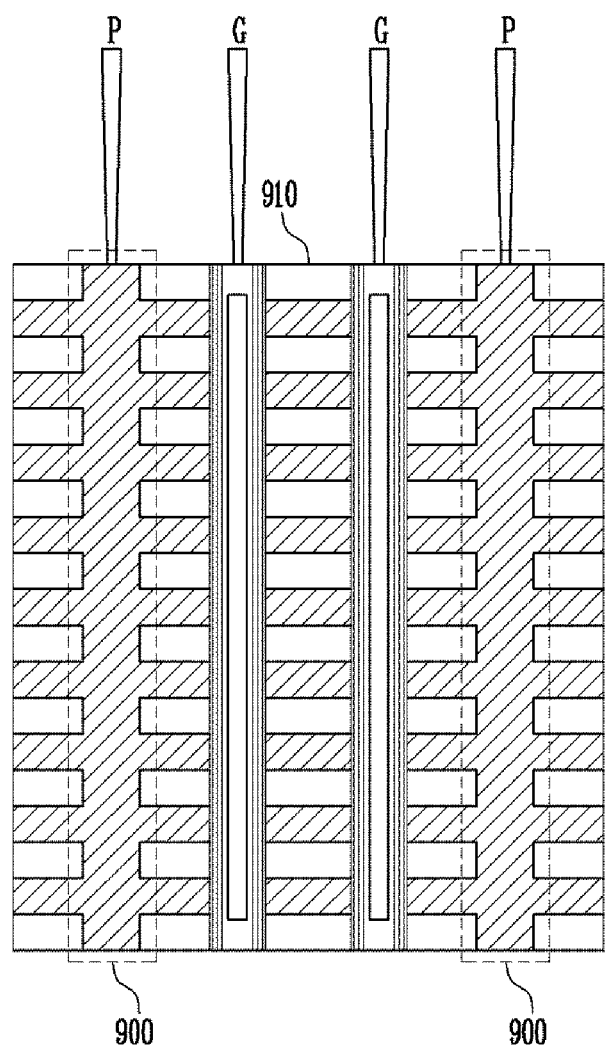
FIG. 9 is a sectional view showing a power decoupling capacitor circuit according to another embodiment of the present disclosure.

FIG. 9 is a sectional view showing a power decoupling capacitor circuit according to another embodiment of the present disclosure.

In the embodiment of FIG. 9, some pillars of the plurality of vertical pillars are slit pillars, and conductive material is injected into slits of the slit pillars. In this case, there is an increase in the number of contact plugs P to which power voltage is applied. The embodiment of FIG. 9 may be configured such that slit regions are formed at predetermined positions in the structure of the embodiment of FIG. 8 and metal material is injected into the slit regions. Thus, in this embodiment, the number of vertical connectors 900 is increased compared to that of the embodiment of FIG. 8.

To embody the embodiment of FIG. 9, in the slitting operation, the slit regions are formed at predetermined positions to form the contact plugs before a contact operation is performed, where the contact operation is performed without performing an etch-back operation. Subsequently, metal material is injected into the slit regions, thus forming a plurality of power voltage application regions.

Figure 10:
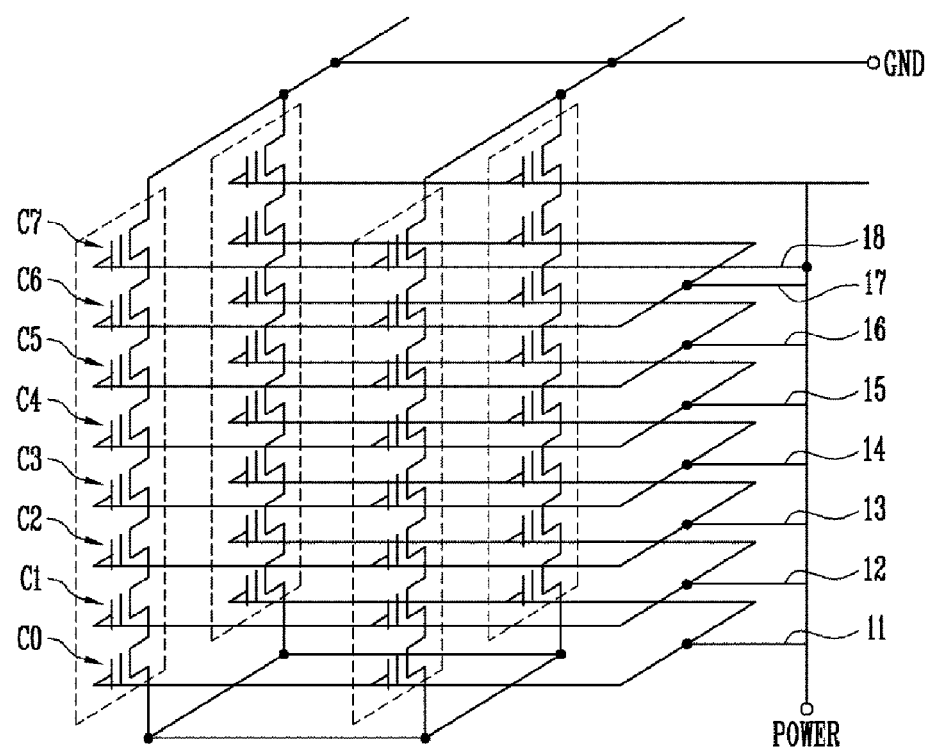
FIG. 10 is a circuit diagram showing an equivalent circuit of the power decoupling capacitor circuit illustrated with reference to FIGS. 7 and 8.

FIG. 10 is a circuit diagram showing an equivalent circuit of the power decoupling capacitor circuit illustrated with reference to FIGS. 7 and 8.

The first to eighth conductive substances 221' to 228' disposed at the first to eighth heights are respectively connected to gate electrodes of the first to eighth capacitors C0 to C7.

According to an embodiment with reference to FIGS. 7 and 8, each pillar corresponds to a single capacitor string. In FIG. 7, because the four pillars are provided, the power decoupling capacitor circuit includes four capacitor strings.

As described with reference to FIGS. 7 and 8, each capacitor string includes transistors disposed at the first to eighths heights. In each capacitor string, the transistors disposed at the first to eighth heights respectively operate as the first to eighth capacitors C0 to C7. The capacitors disposed at the same height are connected in common to a single conductive line. The first to eighth capacitors C0 to C7 of each capacitor string are respectively connected to the first to eighth conductive lines 11 to 18.

The first to eighth conductive lines 11 to 18 may be connected to a single node. This is formed by the vertical connector 700 of FIGS. 7 and 8. In various embodiments, the conductive lines of the capacitor springs that are in difference rows may also be connected to a first node by the vertical connector 700. The conductive lines may be gate electrodes of the capacitors. The first node to which the conductive lines are connected may be a node POWER to which the power voltage is applied.

The plurality of capacitor strings may be connected at an upper position to a second node by the horizontal connector 710 of FIGS. 7 and 8. The second node may be a node GND to which the ground voltage is applied.

FIGS. 11 to 21 are views illustrating a process of forming the power decoupling capacitor circuit according to the embodiment of FIGS. 8 and 9 along with a process of forming the memory cell array.

Figure 11:
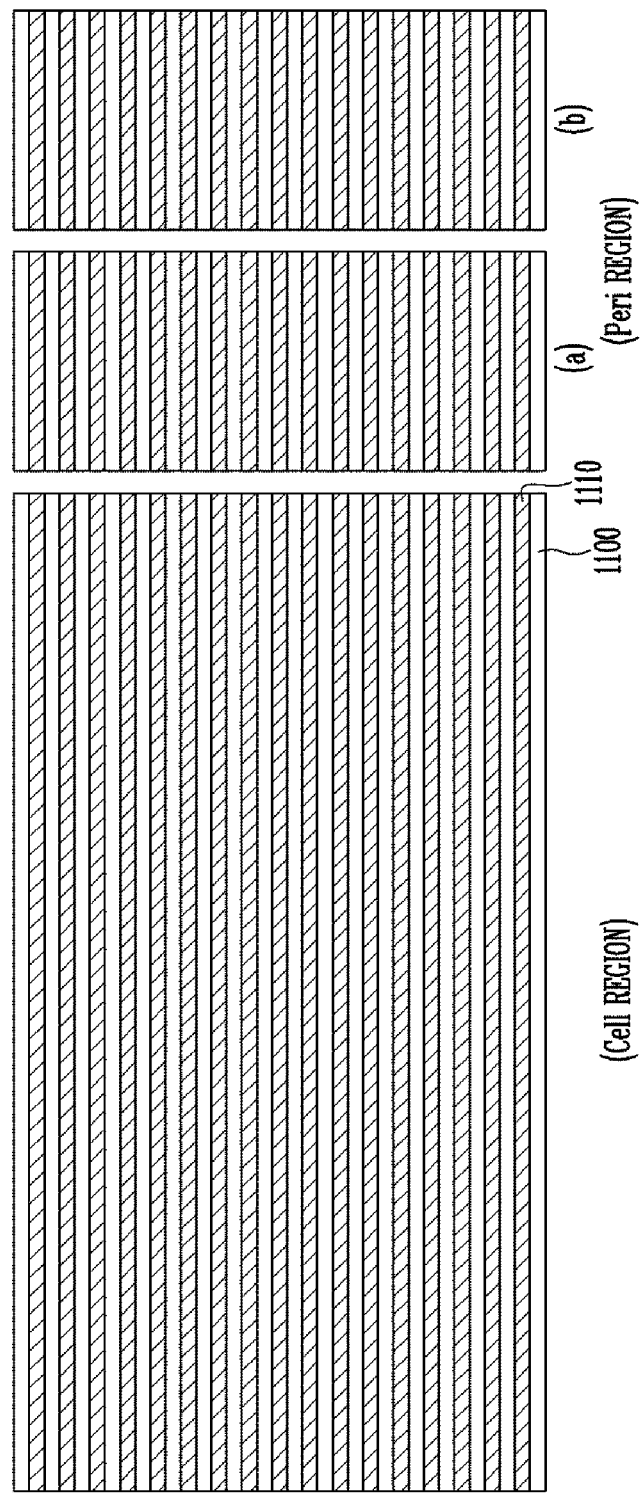
FIG. 11 is a view showing a process of alternately stacking interlayer insulation films and conductive material films.

As shown in FIG. 11, the cell region and the peripheral circuit region are provided. In the cell region the memory cell array is formed. The peripheral circuit region controls operation of the memory cell array. According to an embodiment of the present disclosure, because the structure of the power decoupling capacitor circuit is similar to the structure of the memory block of the memory cell array, the cell region and the peripheral circuit region may be formed through a single mask process rather than being formed through separate mask processes.

Portion (a) of the peripheral circuit region is a view for illustrating a process of forming the power decoupling capacitor circuit according to the embodiment of FIG. 8 (hereinafter, referred to as the first embodiment). Portion (b) of the peripheral circuit region is a view for illustrating a process of forming the power decoupling capacitor circuit according to the embodiment of FIG. 9 (hereinafter, referred to as the second embodiment).

FIG. 11 is a view showing a process of alternately stacking interlayer insulation films and conductive material films. As shown in FIG. 11, the interlayer insulation films 1100 made of insulation material and the conductive material layers 1110, which may be conductive lines, made of conductive material may be alternately stacked on top of one another in both the cell region and the peripheral circuit region. The interlayer insulation films 1100 may be an insulation material which may be made of silicon oxide, and the conductive material films 1110 may be made of polysilicon. In an embodiment, the interlayer insulation films and the conductive material films may form an ON (oxide-nitride) stack.

Figure 12:
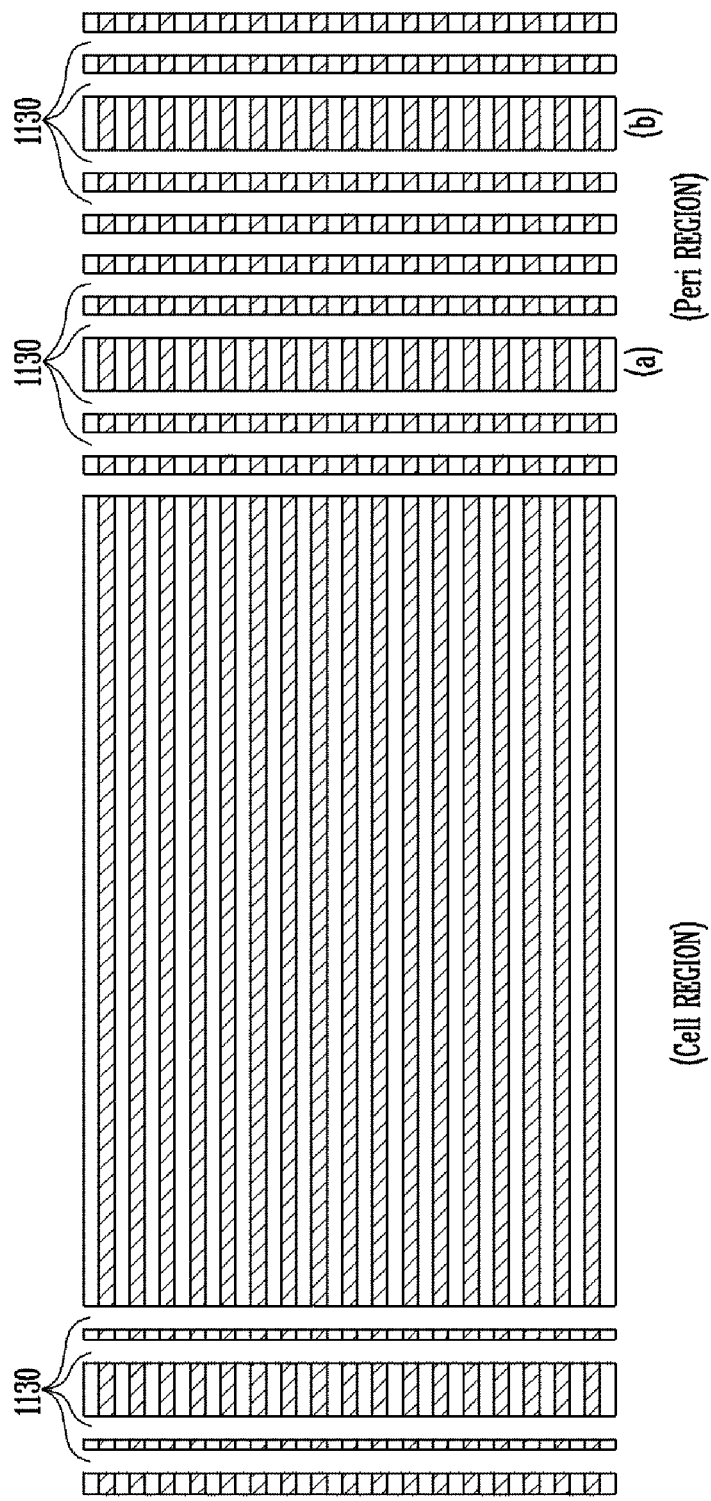
FIG. 12 is a view illustrating a process of removing portions from a stack to provide space for forming pillars.

FIG. 12 is a view illustrating a process of removing portions from the stack to provide space for forming the pillars.

As shown in FIG. 12, an etching process is performed as a preceding process for forming the plurality of pillars in both the cell region and the peripheral circuit region. That is, vertical pillar portions 1130 for forming the plurality of pillars are formed by removing corresponding portions from the stack. This process can be applied to either the first or second embodiment.

Figure 13:
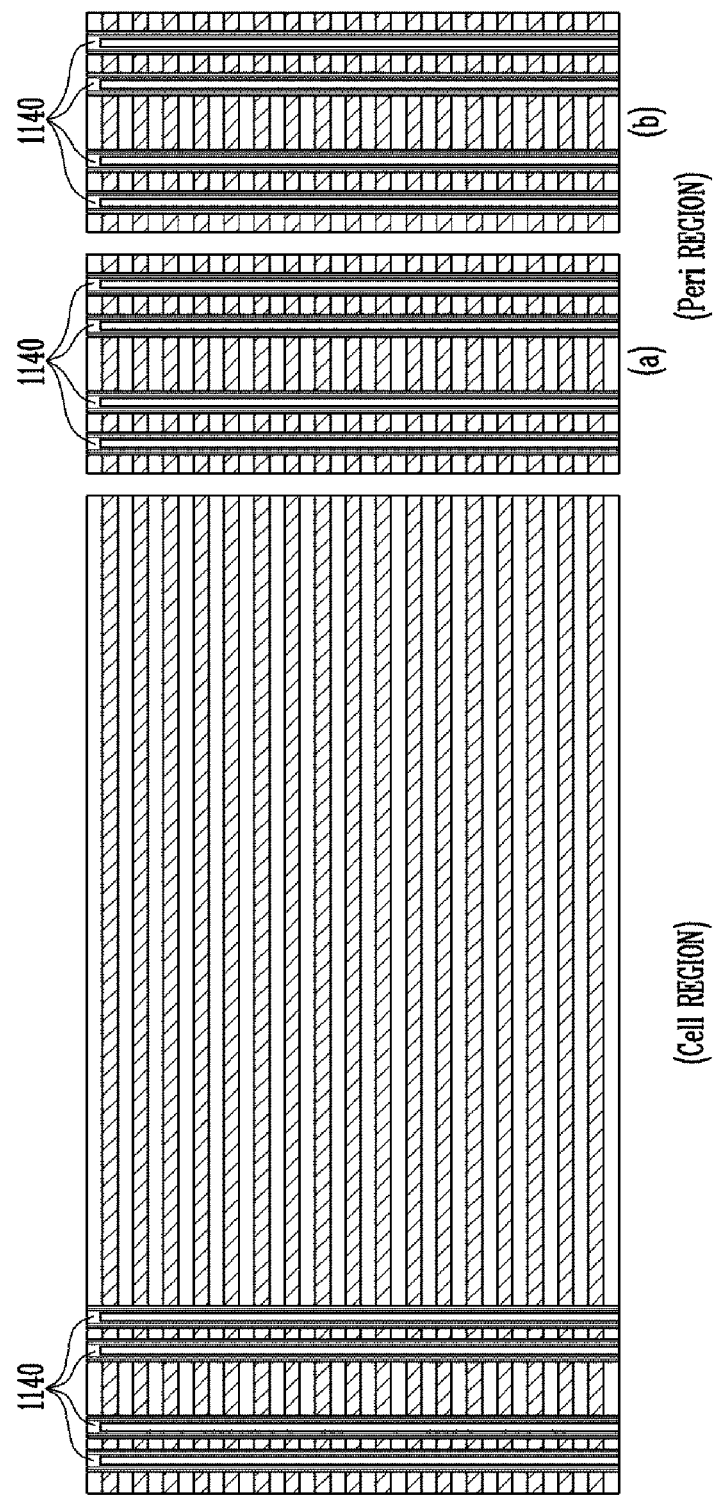
FIG. 13 is a view illustrating a process of injecting ONO to form the pillars.

FIG. 13 is a view illustrating a process of injecting ONO (oxide-nitride-oxide) to form the pillars.

As shown in FIG. 13, in the cell region, ONO 1140 is injected into spaces formed by the etching process, thus forming information storage spaces. In the peripheral circuit region, the ONO 1140 is also injected to form pillars in both the first and second embodiments.

Figure 14:
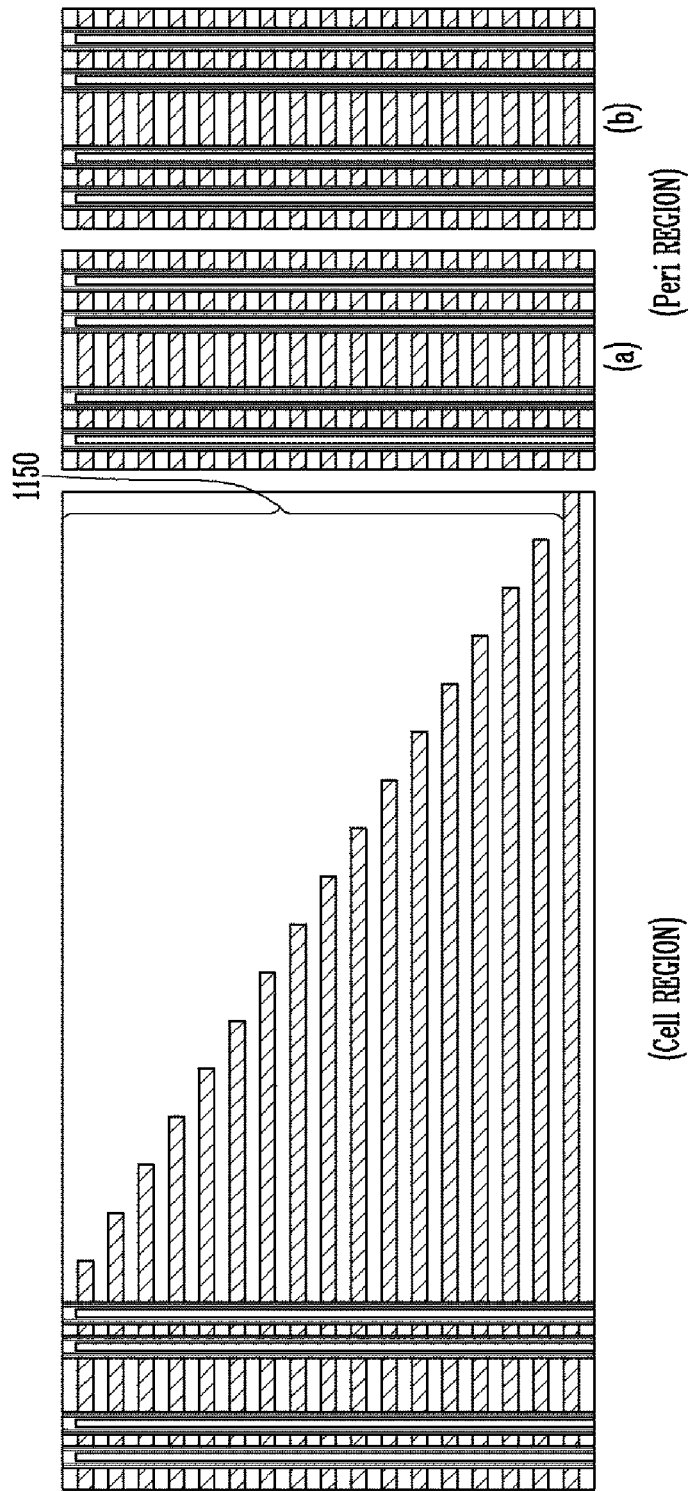
FIG. 14 is a view illustrating a process of slimming a cell region.

FIG. 14 is a view illustrating a process of slimming the cell region.

As shown in FIG. 14, an interconnection region is formed in the cell region and the peripheral circuit region. In the cell region, a slimming process 1150 may be performed to form the contact plugs later. The slimming process 1150 includes removing portions of the interlayer insulation films and the conductive material films in the form of stairs. No slimming process is performed for the peripheral circuit region.

Figure 15:
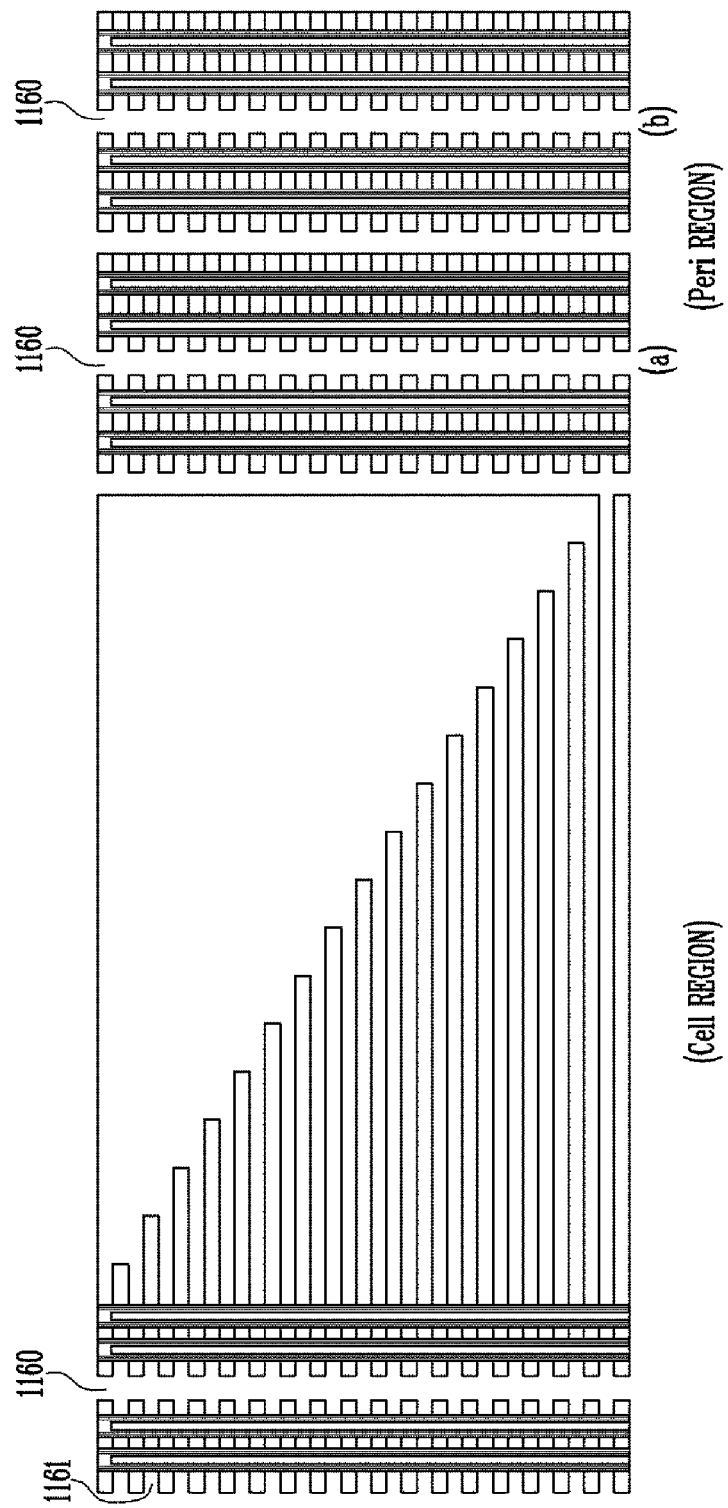
FIG. 15 is a view illustrating a process of forming slit regions and removing portions of the conductive substances.

FIG. 15 is a view illustrating a process of forming slit regions and removing the conductive material.

As shown in FIG. 15, for both the cell region and the peripheral circuit region, slit regions 1160 may be formed, and conductive material layers 1161 may be removed. During this process, methods for forming the slit region 1160 in the peripheral circuit region and removing the conductive material layers 1161 therefrom are the same as those for the cell region. This process can be applied to either the first or second embodiment.

Figure 16:
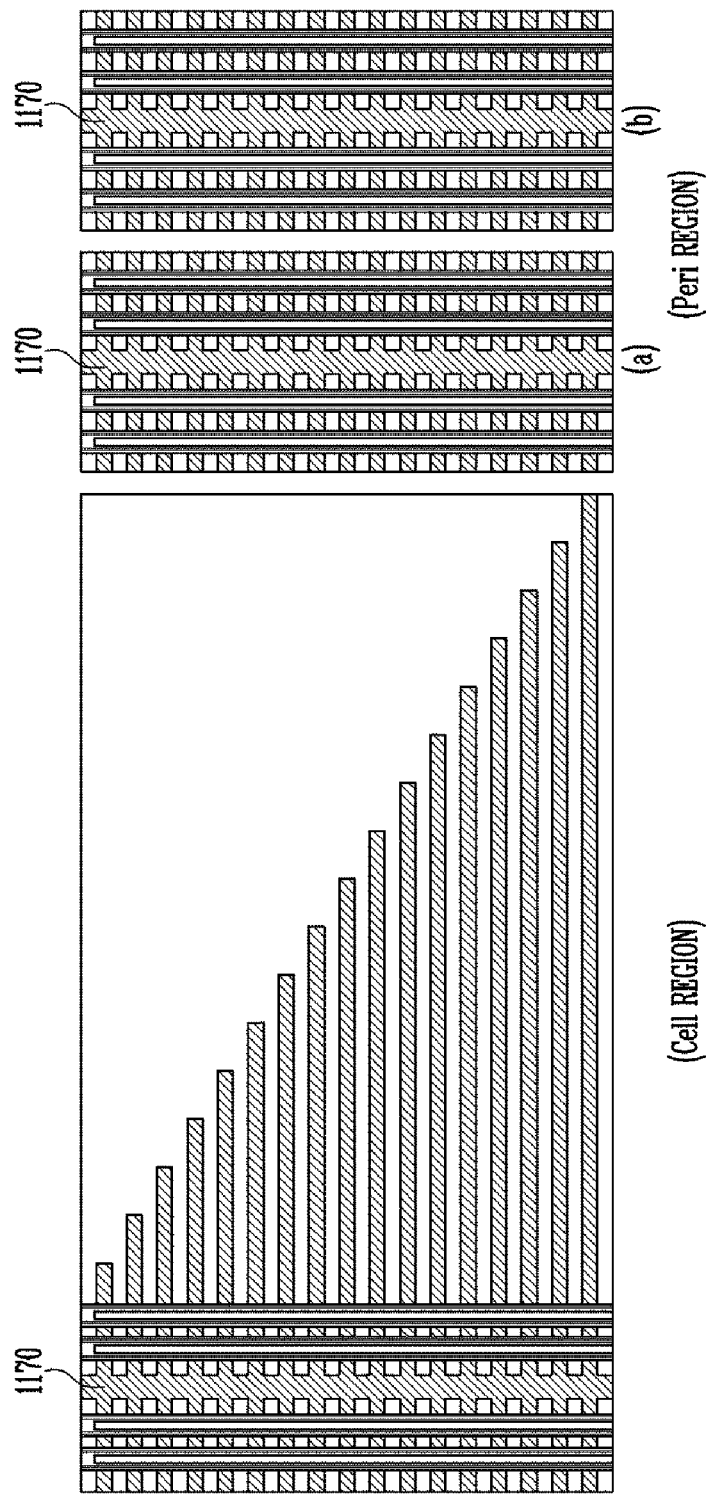
FIG. 16 is a view illustrating a process of injecting metal material into the slit regions.

FIG. 16 is a view illustrating a process of injecting metal material into the slit regions.

As shown in FIG. 16, metal material 1170 is injected into spaces of the slit regions, from which the conductive material films have been removed. The injected metal material forms word lines in the cell region. The process of injecting the metal material 1170 may be performed simultaneously for the cell region and the peripheral circuit region. This process can be applied to either the first or second embodiment.

Figure 21:
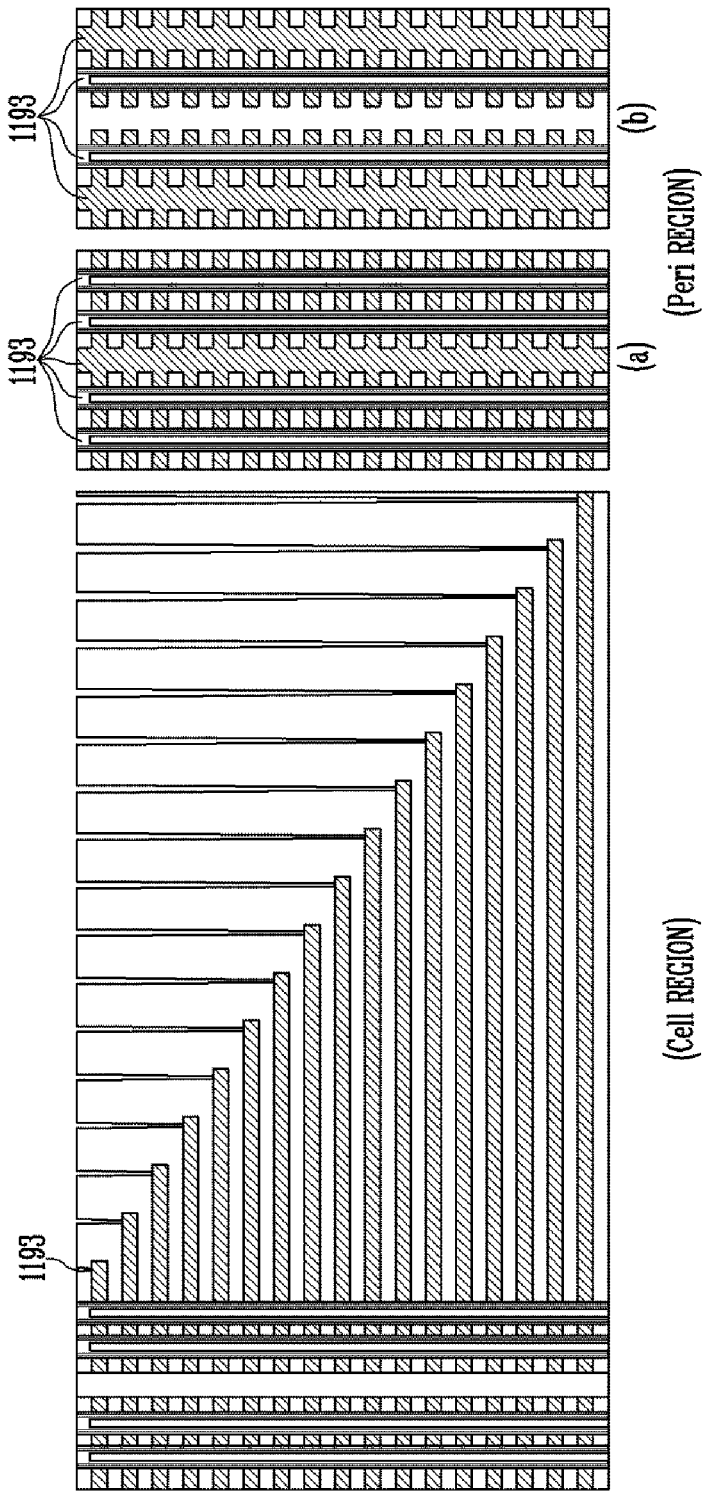
FIG. 21 is a view illustrating an etching process for forming contact plugs.
Figure 22:
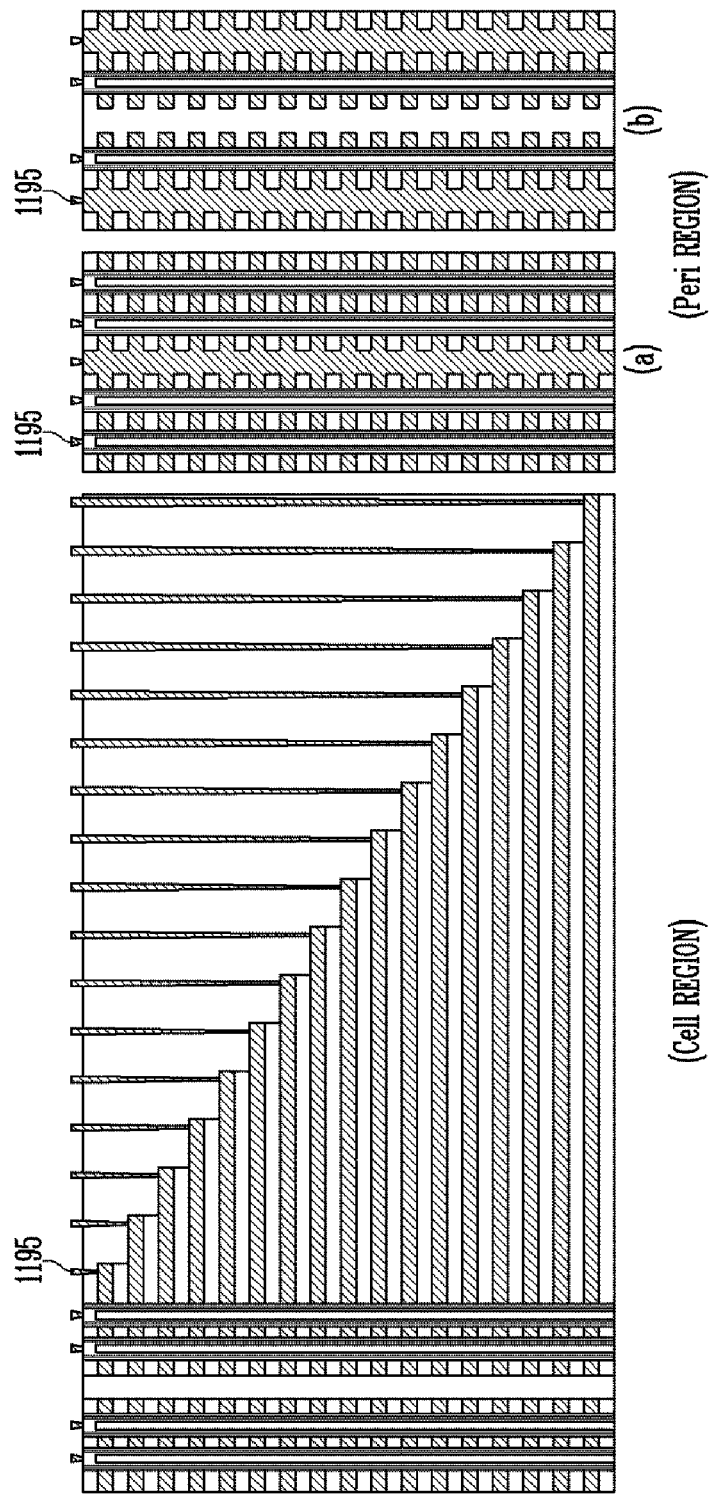
FIG. 22 is a view illustrating a process of embedding metal material to form the contact plugs.
Figure 23:
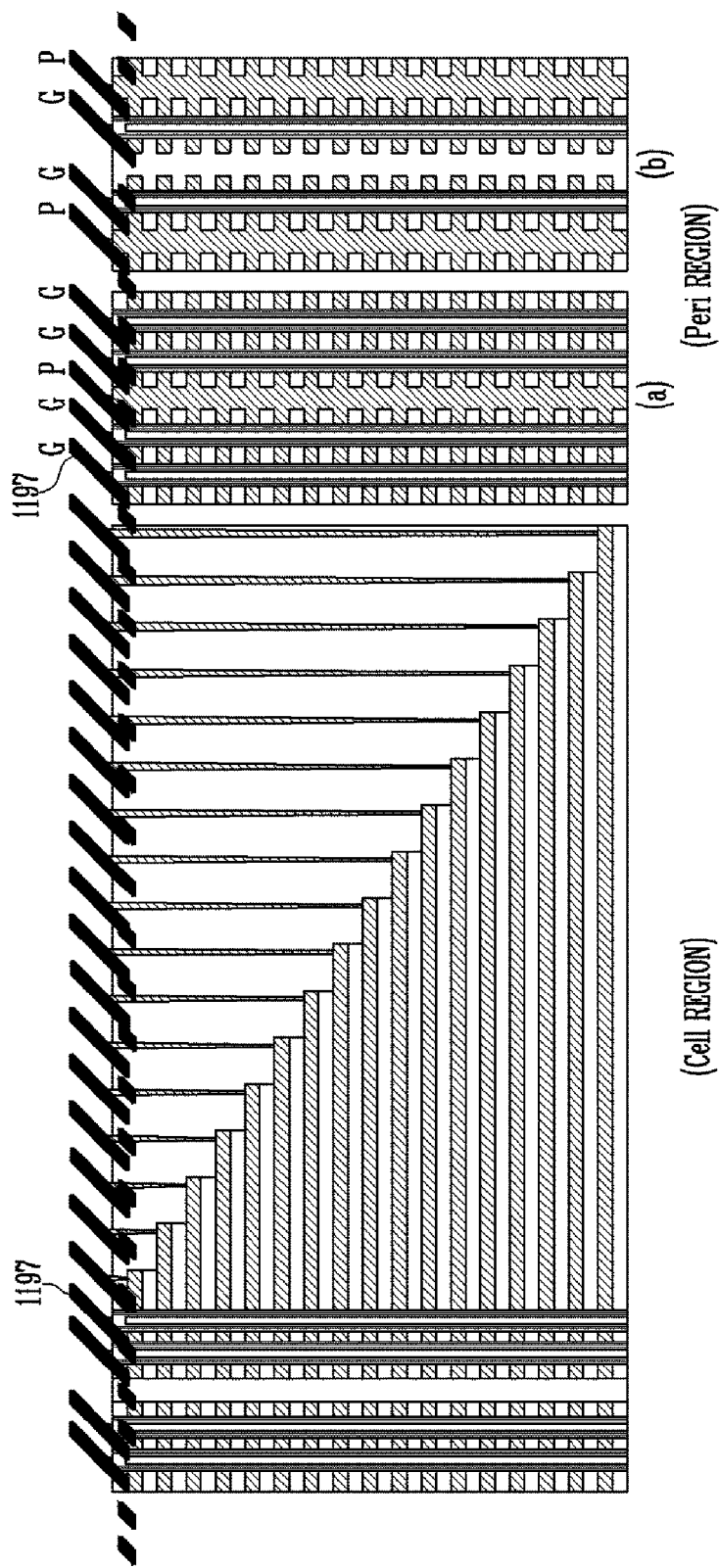
FIG. 23 is a view illustrating electrodes connected to respective contact plugs.

When the process of FIG. 16 is completed, the power decoupling capacitor circuit of the first embodiment is formed. That is, the metal material 1170 injected into the slit regions extends in the vertical direction and thus forms the vertical connector 700 of FIGS. 7 and 8. In the first embodiment, a process of forming contact plugs, which will be explained with reference to FIGS. 21 to 23, is thereafter performed, whereby the power decoupling capacitors can be provided in the semiconductor memory device. Therefore, in the first embodiment, the processes of FIGS. 17 to 20 are not required.

Figure 17:
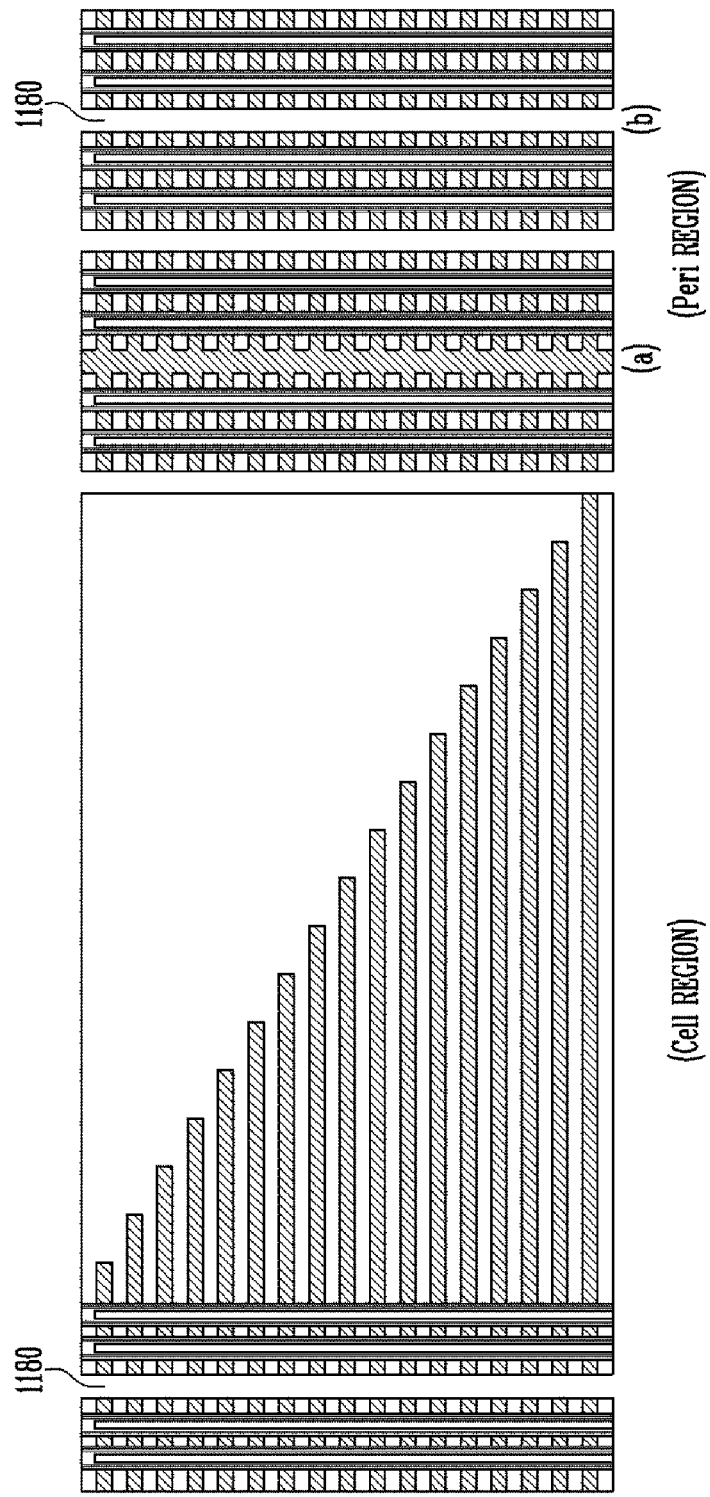
FIG. 17 is a view illustrating a process of forming a slit region and etching the metal material.

FIG. 17 is a view illustrating a process of forming a slit region and etching the metal material.

Referring to FIG. 17, the metal material in the slit region 1180 is removed by etching so that the word lines are not connected to each other in the cell region. Here, for the peripheral circuit region, the same process as that of the second embodiment is performed.

Figure 18:
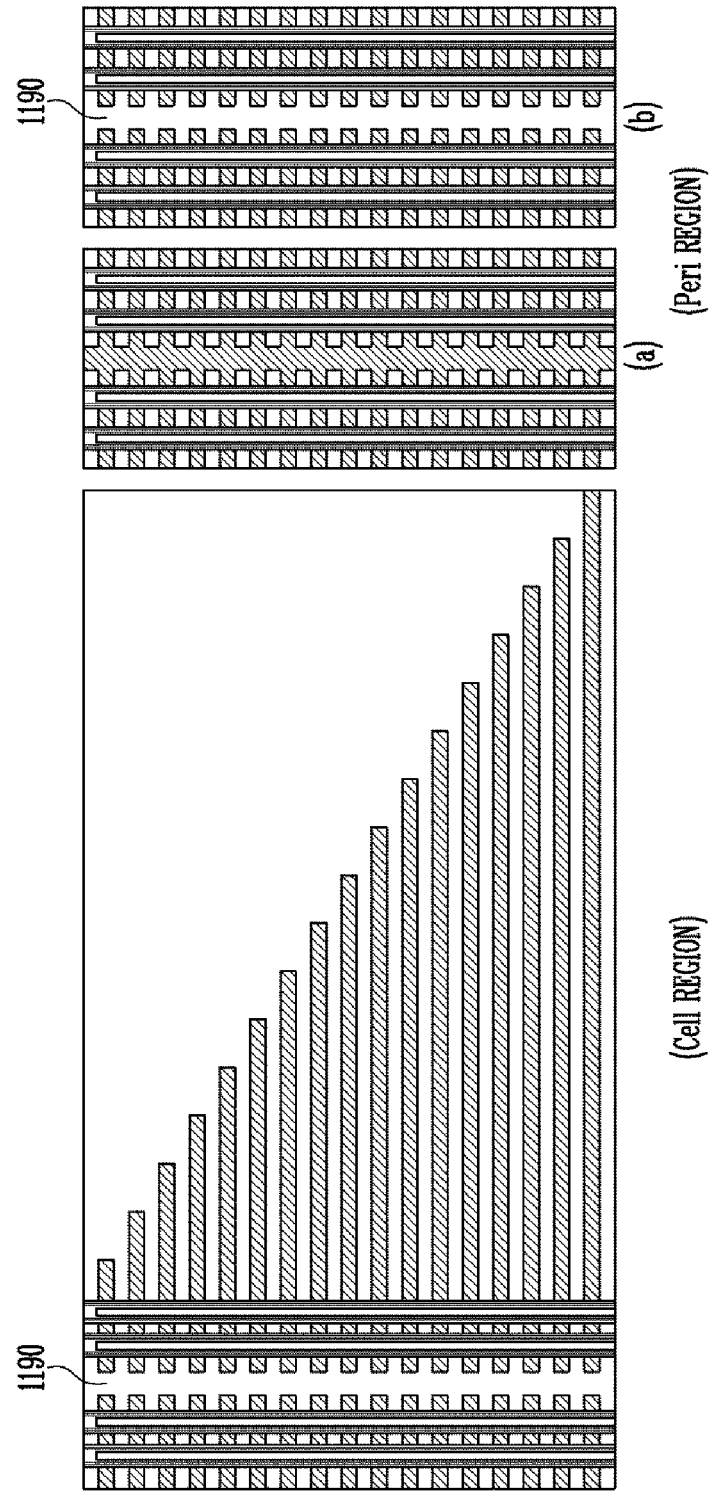
FIG. 18 is a view illustrating a process of injecting insulation material into the region from which the metal material has been removed.

FIG. 18 is a view illustrating a process of injecting insulation material into the region from which the metal material has been removed.

Referring to FIG. 18, in the cell region, insulation material is injected into the slit region 1190, so that opposite sides of the cell region are insulated from each other. In the case of the second embodiment, insulation material is also injected into the slit region 1190 of the peripheral circuit region.

Figure 19:
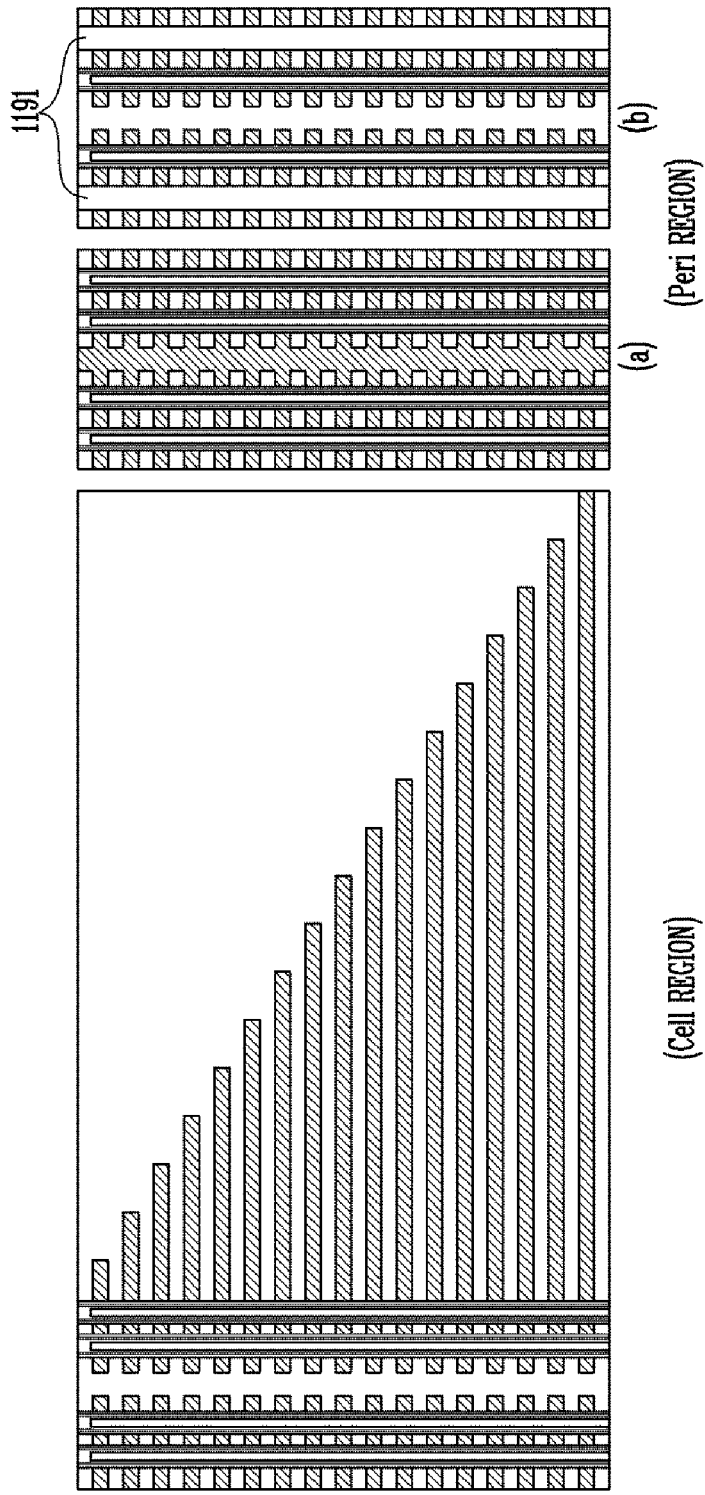
FIG. 19 is a view illustrating a process of forming a slit in a predetermined region to form the power decoupling capacitor circuit according to the embodiment of FIG. 9.

FIG. 19 is a view illustrating a process of forming a slit in a predetermined region to form the power decoupling capacitor circuit according to the embodiment of FIG. 9.

Figure 20:
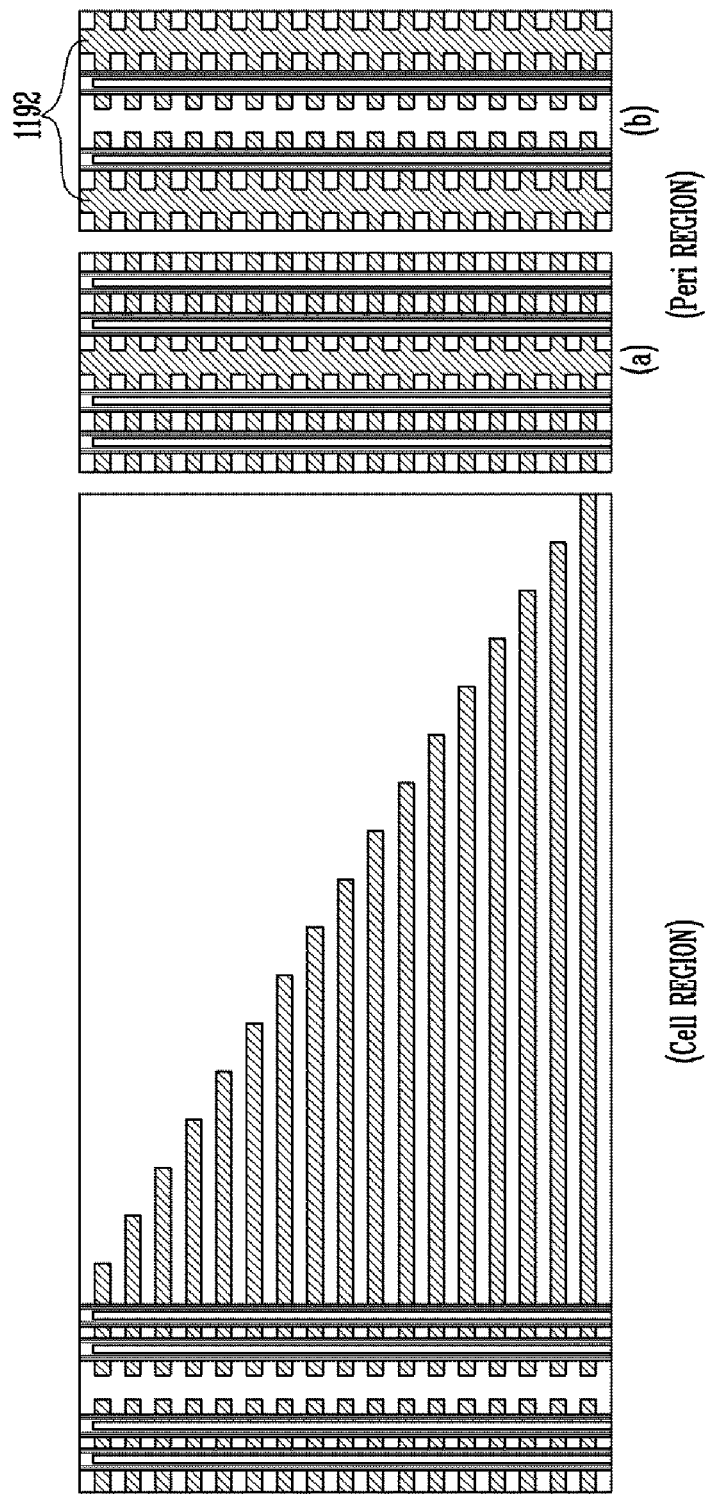
FIG. 20 is a view illustrating a process of injecting metal material into the slit formed through the process of FIG. 19.

The processes of FIGS. 19 and 20 are performed only for the peripheral circuit region of the second embodiment without being performed for the cell region.

According to FIG. 19, the slit region 1191 may be formed in the peripheral circuit region at a position to be applied with the power voltage.

FIG. 20 is a view illustrating a process of injecting metal material into the slit formed through the process of FIG. 19.

According to FIG. 20, metal material 1192 is injected into the slit region formed in the peripheral circuit region through the process of FIG. 19. The metal material 1192 is injected such that the metal material 1192 is connected to the conductive material. The metal material 1192 forms the vertical connector 900 of FIG. 9.

FIG. 21 is a view illustrating an etching process for forming contact plugs.

According to FIG. 21, an etching process for forming contact plugs 1193 is performed. The contact plugs 1193 may be connected to the word lines in the cell region. In detail, in the case of the cell region, the etching process is performed such that the contact plugs 1193 can be brought into contact with the corresponding word lines.

For the peripheral circuit region, an etching process for forming the contact plugs P to be applied with the power voltage and the contact plugs G to be applied with the ground voltage according to the first or second embodiment is performed.

FIG. 22 is a view illustrating a process of embedding metal material to form the contact plugs.

Referring to FIG. 22, metal material 1195 for an electrical connection is injected into the contact plugs formed in the cell region and the peripheral circuit region.

FIG. 23 is a view illustrating electrodes connected to the respective contact plugs.

Referring to FIG. 23, in the cell region, electrodes 1197 are connected to the contact plugs such that the source selection line, the drain selection line and the plurality of word lines are connected to the corresponding contact plugs.

In the case of the peripheral circuit region, a metal region which functioned as an existing word line is connected to the vertical connector by an electrode and the power voltage is applied thereto. In addition, channel portions of the memory cells are connected to the horizontal connector by electrodes 1197 and the ground voltage is applied thereto. In this way, the power decoupling capacitors are formed.

According to the above-mentioned embodiments of the present disclosure, the power decoupling capacitor circuit is embodied in such a way that capacitors having a three-dimensional memory cell array shape are formed in a peripheral circuit region, whereby the capacitance per unit area can be increased. Furthermore, compared to the conventional capacitor connection structure using word lines, the area of the device can be reduced because there is no need for space needed to form a separate word like connection in the conventional technique. In addition, power short phenomenon attributable to a word line bridge (WL bridge) can be prevented.

Figure 24:
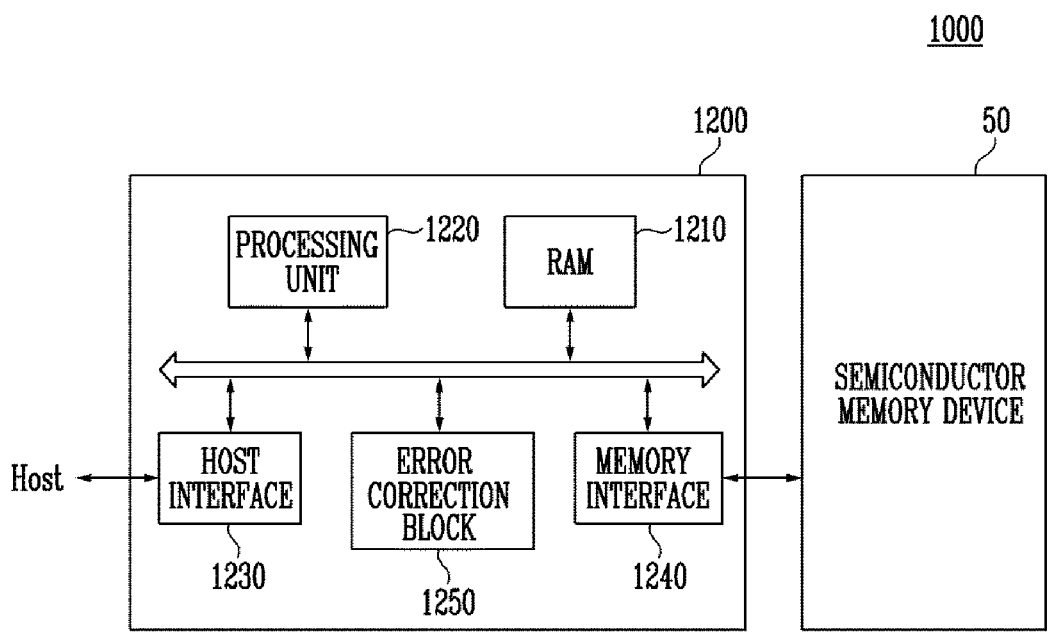
FIG. 24 is a block diagram illustrating a memory system including the semiconductor memory device of FIG. 1.

FIG. 24 is a block diagram illustrating a memory system 1000 including the semiconductor memory device 50 of FIG. 1.

Referring to FIG. 24, the memory system 1000 includes the semiconductor memory device 50 and a controller 1200.

The semiconductor memory device 50 may have the same configuration and operation as those of the semiconductor memory device described with reference to FIG. 1. Hereinafter, the repetitive explanations will be omitted.

The controller 1200 is connected to a host and the semiconductor memory device 50. In response to a request from the host, the controller 1200 accesses the semiconductor memory device 50. For example, the controller 1200 controls read, write, remove, and background operations of the semiconductor memory device 50. The controller 1200 provides an interface between the host and the semiconductor memory device 50. The controller 1200 drives firmware for controlling the semiconductor memory device 50.

The controller 1200 includes a RAM (random access memory) 1210, a processing unit 1220, a host interface 1230, a memory interface 1240, and an error correction block 1250.

The RAM 1210 is used as at least one of operating memory for the processing unit 1220, cache memory between the semiconductor memory device 50 and the host, and buffer memory between the semiconductor memory device 50 and the host.

The processing unit 1220 controls the overall operation of the controller 1200.

The processing unit 1220 is configured to randomize data received from the host. For example, the processing unit 1220 may use a randomizing seed to randomize data received from the host. Randomized data, which is data to be stored (DATA, refer to FIG. 1), is provided to the semiconductor memory device 50 and programmed in the memory cell array (100, refer to FIG. 1).

The processing unit 1220 is configured to derandomize data received from the semiconductor memory device 50 during a read operation. For example, the processing unit 1220 may use a derandomizing seed to derandomize data received from the semiconductor memory device 50. Derandomized data may be output to the host.

In an embodiment, the processing unit 1220 may drive software or firmware to perform the randomizing or derandomizing operation.

The host interface 1230 includes a protocol for performing a data exchange between the host and controller 1200. In an example embodiment, the controller 1200 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1240 interfaces with the semiconductor memory device 50. For example, the memory interface includes a NAND interface or a NOR interface.

The error correction block 1250 uses an error correction code (ECC) to detect and correct errors in data received from the semiconductor memory device 50.

The controller 1200 and the semiconductor memory device 50 may be integrated into a single semiconductor device. In an example embodiment, the controller 1200 and the semiconductor memory device 50 may be integrated into a single semiconductor device to form a memory card. For example, the controller 1200 and the semiconductor memory device 50 may be integrated into a single semiconductor device to form a memory card such as a personal computer memory card international association (PCMCIA) card, a compact flash (CF) card, a smart media card (SMC), a memory stick multimedia card (MMC, RS-MMC, or MMCmicro), an SD card (SD, miniSD, microSD, or SDHC), a universal flash storage (UFS), and the like.

The controller 1200 and the semiconductor memory device 50 may be integrated into a single semiconductor device to form a solid state drive (SSD). The SSD includes a storage device formed to store data in semiconductor memory. When the memory system 1000 is used as the SSD, the operation speed of the host connected to the memory system 1000 may be phenomenally improved.

In another embodiment, the memory system 1000 may be provided as one of various elements of an electronic device such as a computer, a ultra mobile PC (UMPC), a workstation, a netbook, a personal digital assistant (PDA), a portable computer, a web tablet, a wireless phone, a mobile phone, a smart phone, an e-book, a portable multimedia player (PMP), a game console, a navigation device, a black box, a digital camera, a three-dimensional television, a digital audio recorder, a digital audio player, a digital picture recorder, a digital picture player, a digital video recorder, a digital video player, a device capable of transmitting/receiving information in a wireless environment, one of various devices for forming a home network, one of various electronic devices for forming a computer network, one of various electronic devices for forming a telematics network, an RFID device, one of various elements for forming a computing system, or the like.

In an example embodiment, the semiconductor memory device 50 or the memory system 1000 may be embedded in various types of packages. For example, the semiconductor memory device 50 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 25:
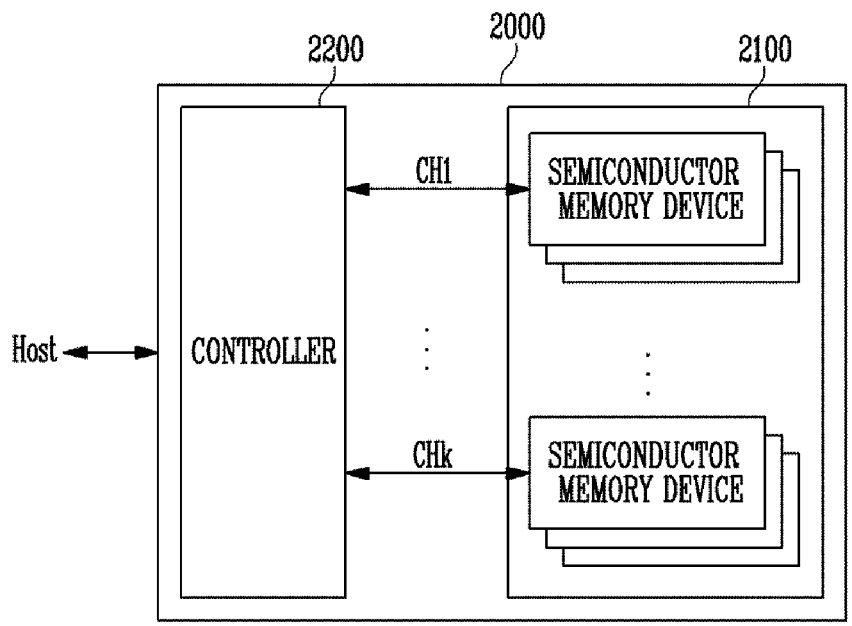
FIG. 25 is a block diagram showing an example of application of the memory system of FIG. 24.

FIG. 25 is a block diagram showing an example 2000 of application of the memory system 1000 of FIG. 24.

Referring to FIG. 25, the memory system 2000 includes the semiconductor memory device 2100 and a controller 2200. The semiconductor memory device 2100 includes a plurality of memory chips. The semiconductor memory chips are divided into a plurality of groups.

In FIG. 25, it is illustrated that each of the plurality of groups communicates with the controller 2200 through first to k-th channels CH1 to CHk. Each semiconductor memory chip is configured to operate in the same manner as that of an embodiment of the semiconductor memory device 50 described with reference to FIG. 1.

Each group communicates with the controller 2200 through one common channel. The controller 2200 has the same configuration as that of the controller 1200 described with reference to FIG. 24. The controller 2200 is configured to control a plurality of memory chips of the semiconductor memory device 2100 through the plurality of channels CH1 to CHk.

In FIG. 25, a plurality of semiconductor memory chips are illustrated as being connected to each channel. However, it will be understood that the memory system 2000 may be configured such that a single memory chip is connected to each channel.

Figure 26:
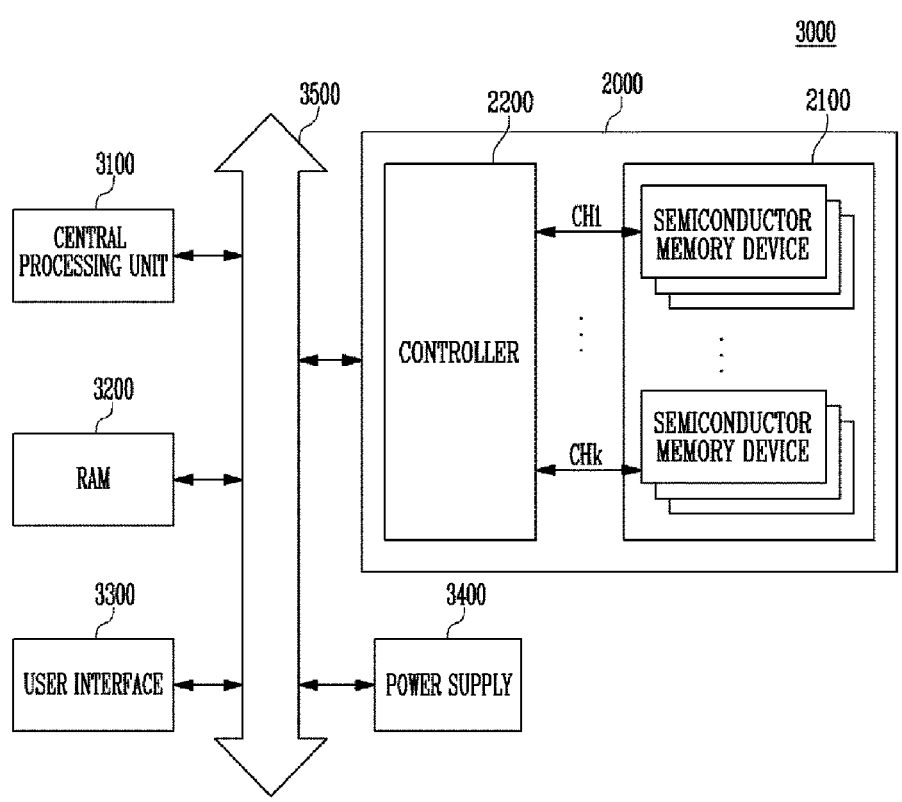
FIG. 26 is a block diagram illustrating a computing system including the memory system explained in relation to FIG. 25.

FIG. 26 is a block diagram illustrating a computing system 3000 including the memory system 2000 explained in relation to FIG. 25.

Referring to FIG. 26, the computing system 3000 includes a central processing unit 3100, a RAM 3200, a user interface 3300, a power supply 3400, a system bus 3500, and a memory system 2000.

The memory system 2000 is electrically connected to the CPU 3100, the RAM 3200, the user interface 3300, and the power supply 3400 through the system bus 3500. Data provided through the user interface 3300 or processed by the CPU 3100 is stored in the memory system 2000.

In FIG. 26, the semiconductor memory device 2100 is illustrated as being connected to the system bus 3500 through the controller 2200. However, the semiconductor memory device 2100 may be directly connected to the system bus 3500. The function of the controller 2200 may be performed by the CPU 3100 and the RAM 3200.

In FIG. 26, the memory system 2000 described with reference to FIG. 25 is illustrated as being used. However, the memory system 2000 of FIG. 26 may be replaced with the memory system 1000 described with reference to FIG. 24. In an embodiment, the computing system 3000 may include all of the memory systems 1000 and 2000 described with reference to FIGS. 24 and 25.

As described above, various embodiments of the present disclosure provide a semiconductor memory device which has an increased degree of integration.

Although the example embodiments of the present disclosure have been disclosed, those skilled in the art will appreciate that various modifications, additions and substitutions are possible, without departing from the scope and spirit of the disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not always be performed in regular order. Furthermore, the embodiments disclosed in the present specification and the drawings aim to help those with ordinary knowledge in the art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Meanwhile, example embodiments of the present disclosure have been described with reference to the accompanying drawings, and specific terms or words used in the description should be construed in accordance with the spirit of the present disclosure without limiting the subject matter thereof. In other words, one of ordinary skill in the art to which the present disclosure belongs will be able to easily understand that various modifications are possible based on the technical scope of the present disclosure.

What is claimed is:

1. A semiconductor memory device comprising:
a memory cell array having a multilayer stacked structure; and
a peripheral circuit configured to drive the memory cell array,
wherein the peripheral circuit comprises a power decoupling capacitor circuit configured to provide decoupling capacitors to the memory cell array and the peripheral circuit,
wherein the power decoupling capacitor circuit comprises:
conductive lines alternately stacked on top of one another;
a plurality of semiconductor pillars configured to pass through the conductive lines;
a horizontal connector configured to connect the semiconductor pillars to each other; and
a vertical connector configured to pass through the conductive lines and insulated from the horizontal connector.

2. The semiconductor memory device according to claim 1, wherein a contact plug to which a power voltage is applied is formed on an upper portion of the vertical connector, and another contact plug to which a ground voltage is applied is formed on an upper portion of the horizontal connector.

3. The semiconductor memory device according to claim 1, wherein the vertical connector is configured to connect the conductive lines to each other in a vertical direction.

4. The semiconductor memory device according to claim 1, wherein each of the semiconductor pillars comprises a capacitor string including a plurality of transistors, and
the conductive lines are connected to respective gate electrodes of the plurality of transistors.

5. The semiconductor memory device according to claim 1, wherein each of the semiconductor pillars is brought into contact with at least one of the conductive lines.

6. The semiconductor memory device according to claim 1, wherein each of the semiconductor pillars comprises: an internal material including an insulation material; an intermediate layer; and a surface layer,
wherein the surface layer comprises a tunneling insulation film, a charge storage film, and a blocking insulation film which are successively disposed from the intermediate layer.

7. The semiconductor memory device according to claim 1, wherein each of the conductive lines is made of conductive material, wherein the conductive material is formed of polysilicon.

8. The semiconductor memory device according to claim 1, further comprising an insulation material formed between the conductive lines.

9. The semiconductor memory device according to claim 8, wherein the insulation material is silicon oxide.

10. A semiconductor memory device comprising:
a semiconductor substrate including a cell region and a peripheral circuit region;
conductive lines stacked on top of one another in the cell region and the peripheral circuit region;
a plurality of semiconductor pillars configured to pass through the conductive lines;
a horizontal connector configured to connect the semiconductor pillars that are disposed in the peripheral circuit region; and
a vertical connector configured to pass through the conductive lines that are disposed in the peripheral circuit region, the vertical connector being insulated from the horizontal connector,
wherein each of the semiconductor pillars that are disposed in the peripheral circuit region comprises a capacitor string including a plurality of transistors, and
the conductive lines are connected to respective gate electrodes of the plurality of transistors.

11. The semiconductor memory device according to claim 10, wherein a contact plug to which a power voltage is applied is formed on an upper portion of the vertical connector, and another contact plug to which a ground voltage is applied is formed on an upper portion of the horizontal connector.

12. The semiconductor memory device according to claim 10, wherein the vertical connector is configured to connect the conductive lines to each other in a vertical direction.

13. The semiconductor memory device according to claim 10, wherein the semiconductor pillars is brought into contact with at least one of the conductive lines.

14. The semiconductor memory device according to claim 10, wherein each of the semiconductor pillars comprises:
an internal material including an insulation material; an intermediate layer; and a surface layer,
wherein the surface layer comprises a tunneling insulation film, a charge storage film, and a blocking insulation film which are successively disposed from the intermediate layer.

15. The semiconductor memory device according to claim 10, wherein each of the conductive lines is made of conductive material, wherein the conductive material is formed of polysilicon.

16. The semiconductor memory device according to claim 10, further comprising an insulation material formed between the conductive lines.

17. The semiconductor memory device according to claim 16, wherein the insulation material is silicon oxide.

* * * * *